US011727989B2

(12) United States Patent
Tran et al.

(10) Patent No.: US 11,727,989 B2
(45) Date of Patent: Aug. 15, 2023

(54) PROGRAMMING ANALOG NEURAL MEMORY CELLS IN DEEP LEARNING ARTIFICIAL NEURAL NETWORK

(71) Applicant: Silicon Storage Technology, Inc., San Jose, CA (US)

(72) Inventors: Hieu Van Tran, San Jose, CA (US); Thuan Vu, San Jose, CA (US); Stanley Hong, San Jose, CA (US); Anh Ly, San Jose, CA (US); Vipin Tiwari, Dublin, CA (US); Nhan Do, Saratoga, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 17/734,807

(22) Filed: May 2, 2022

(65) Prior Publication Data

US 2022/0254414 A1    Aug. 11, 2022

Related U.S. Application Data

(62) Division of application No. 17/191,392, filed on Mar. 3, 2021, now Pat. No. 11,521,683, which is a division
(Continued)

(51) Int. Cl.
*G11C 16/04* (2006.01)
*G06N 3/08* (2023.01)
(Continued)

(52) U.S. Cl.
CPC ........... *G11C 16/0425* (2013.01); *G06N 3/08* (2013.01); *H01L 29/7883* (2013.01);
(Continued)

(58) Field of Classification Search
CPC ..... G11C 16/0425; G11C 16/14; G11C 16/10; G11C 16/30; G11C 11/54; G06N 3/08;
(Continued)

(56) References Cited

U.S. PATENT DOCUMENTS 5,029,130 A    7/1991  Yeh
5,764,090 A    6/1998  Yeh
(Continued)

FOREIGN PATENT DOCUMENTS

CN    103886916    6/2014
CN    107665718    2/2018
(Continued)

OTHER PUBLICATIONS

Taiwanese Search Report corresponding to the Taiwanese Patent Application No. 111109346 dated May 20, 2022.
(Continued)

*Primary Examiner* — Fernando Hidalgo
(74) *Attorney, Agent, or Firm* — DLA Piper LLP US

(57) ABSTRACT

Numerous embodiments are disclosed for a high voltage generation algorithm and system for generating high voltages necessary for a particular programming operation in analog neural memory used in a deep learning artificial neural network. In one example, a method for programming a plurality of non-volatile memory cells in an array of non-volatile memory cells, comprises generating a high voltage, and programming a plurality of non-volatile memory cells in an array using the high voltage when a programming enable signal is asserted and providing a feedback loop to maintain the high voltage while programming the plurality of non-volatile memory cells.

10 Claims, 40 Drawing Sheets

Related U.S. Application Data of application No. 16/550,253, filed on Aug. 25, 2019, now Pat. No. 10,943,661, which is a division of application No. 16/042,972, filed on Jul. 23, 2018, now Pat. No. 10,522,226.

(60) Provisional application No. 62/665,359, filed on May 1, 2018.

(51) Int. Cl.
  *H01L 29/788* (2006.01)
  *H10B 41/30* (2023.01)
  *G06N 3/045* (2023.01)

(52) U.S. Cl.
  CPC ......... *H01L 29/7885* (2013.01); *H10B 41/30* (2023.02); *G06N 3/045* (2023.01)

(58) Field of Classification Search
  CPC .... G06N 3/0454; G06N 3/0635; G06N 3/045; G06N 3/065; H01L 27/11521; H01L 29/7883; H01L 29/7885; H01L 29/42328; H10B 41/30
  USPC ..................................................... 365/185.29
  See application file for complete search history.

(56) References Cited

U.S. PATENT DOCUMENTS

| | | | |
|---|---|---|---|
| 6,493,265 B2 | 12/2002 | Satoh | |
| 6,747,310 B2 | 6/2004 | Fan | |
| 7,599,225 B2 | 10/2009 | Loh | |
| 7,855,913 B2 | 12/2010 | Fernandes | |
| 8,223,558 B2 | 7/2012 | Tanaka | |
| 8,379,452 B2 | 2/2013 | Nagamatsu | |
| 8,400,864 B1 | 3/2013 | McCombs | |
| 9,779,833 B2 | 10/2017 | Joo | |
| 9,842,653 B2 | 12/2017 | Lee | |
| 10,229,744 B2 | 3/2019 | Dutta | |
| 10,249,367 B2 | 4/2019 | Yoon | |
| 10,431,267 B2 | 10/2019 | Hong | |
| 2006/0104120 A1 | 5/2006 | Hemink | |
| 2007/0297238 A1* | 12/2007 | Cho | G11C 5/147 365/185.23 |
| 2008/0272805 A1 | 11/2008 | Way | |
| 2009/0016116 A1 | 1/2009 | Lo | |
| 2012/0268999 A1 | 10/2012 | Tan | |
| 2015/0213848 A1* | 7/2015 | Park | G11C 16/10 365/189.011 |
| 2015/0380060 A1 | 12/2015 | Hong | |
| 2016/0019947 A1 | 1/2016 | Pang et al. | |
| 2016/0111165 A1 | 4/2016 | Shim | |
| 2016/0161961 A1 | 6/2016 | El-Nozahi | |
| 2016/0379713 A1 | 12/2016 | Kang | |
| 2017/0091616 A1 | 3/2017 | Gokmen | |
| 2017/0337466 A1 | 11/2017 | Bayat | |
| 2018/0040367 A1 | 2/2018 | Wu | |
| 2018/0075900 A1 | 3/2018 | Ishizu | |
| 2018/0102704 A1* | 4/2018 | Achter | G11C 16/30 |
| 2018/0286488 A1 | 10/2018 | Sanasi | |
| 2019/0147961 A1 | 5/2019 | Lee | |
| 2019/0164617 A1 | 5/2019 | Tran | |
| 2019/0207034 A1* | 7/2019 | Daryanani | H01L 29/7885 |
| 2019/0213234 A1 | 7/2019 | Bayat | |
| 2019/0333592 A1 | 10/2019 | Lee | |

FOREIGN PATENT DOCUMENTS

| | | |
|---|---|---|
| JP | 3718251 | 11/2005 |
| JP | 3842609 | 11/2006 |
| JP | 2008-544435 | 12/2008 |
| JP | 2012-109003 | 6/2012 |

OTHER PUBLICATIONS

Japanese Office Action dated Jan. 17, 2023 corresponding to the related Japanese Patent Application No. 2020-560979.
S. Korean Office Action dated Dec. 28, 2022 corresponding to the related S. Korea Patent Application No. 10-2020-7031553.

* cited by examiner

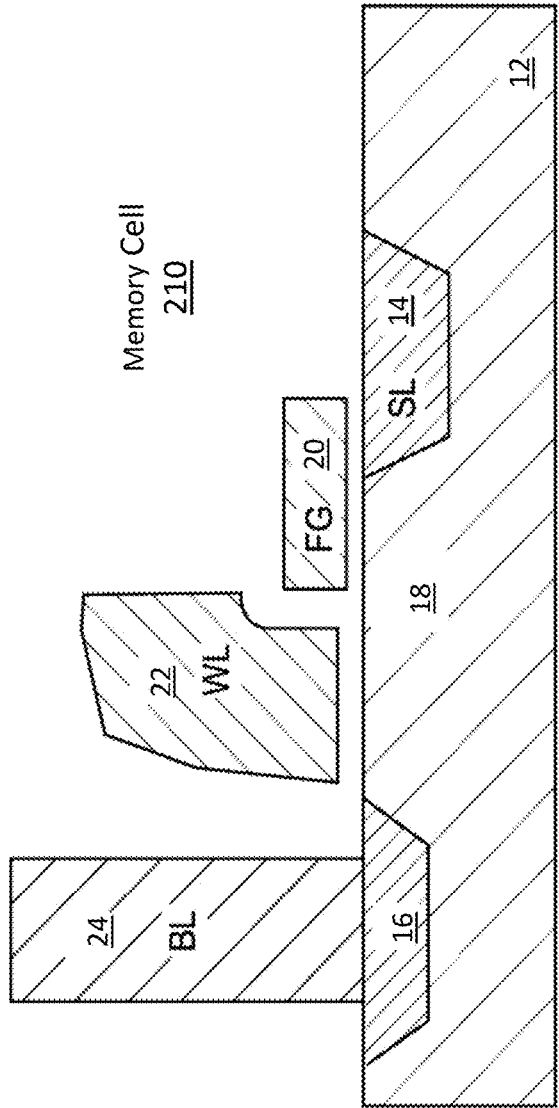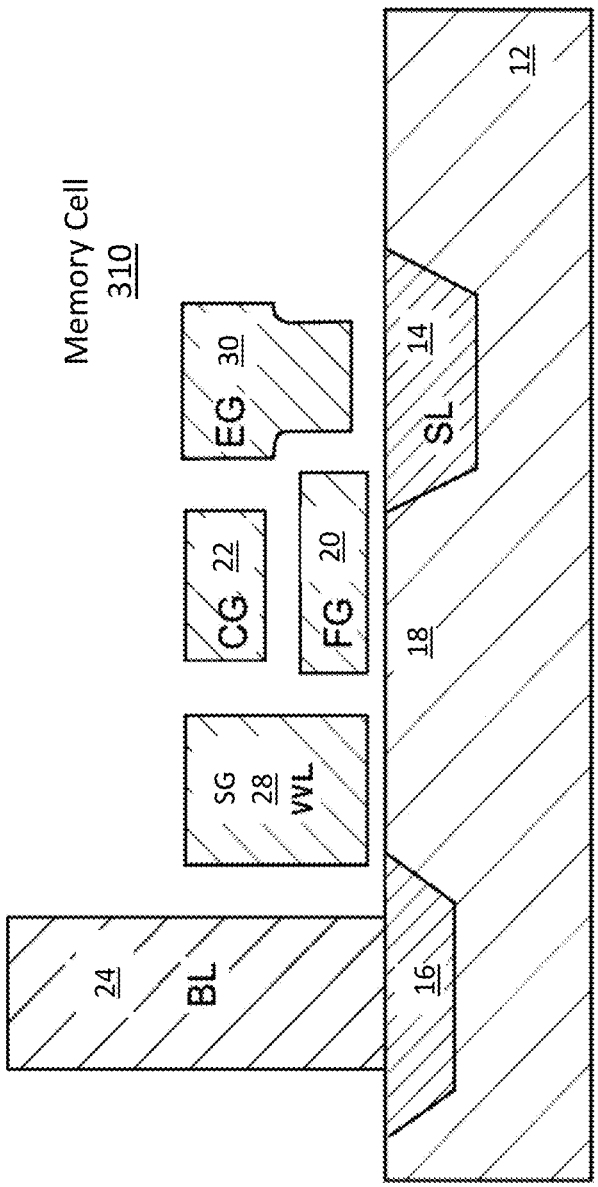
FIGURE 2
(PRIOR ART)
FIGURE 3
(PRIOR ART)

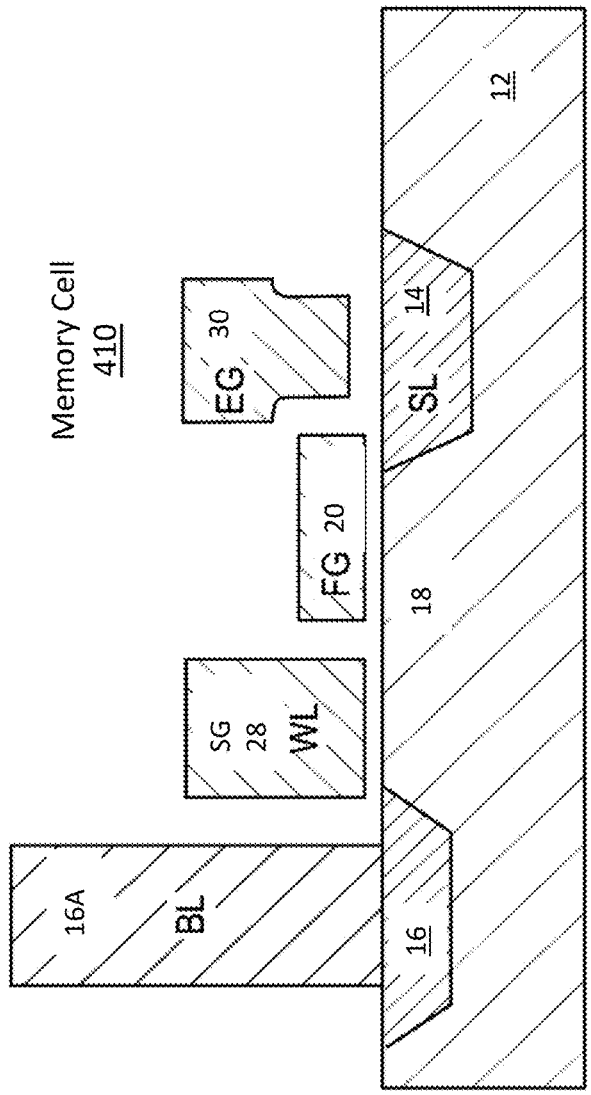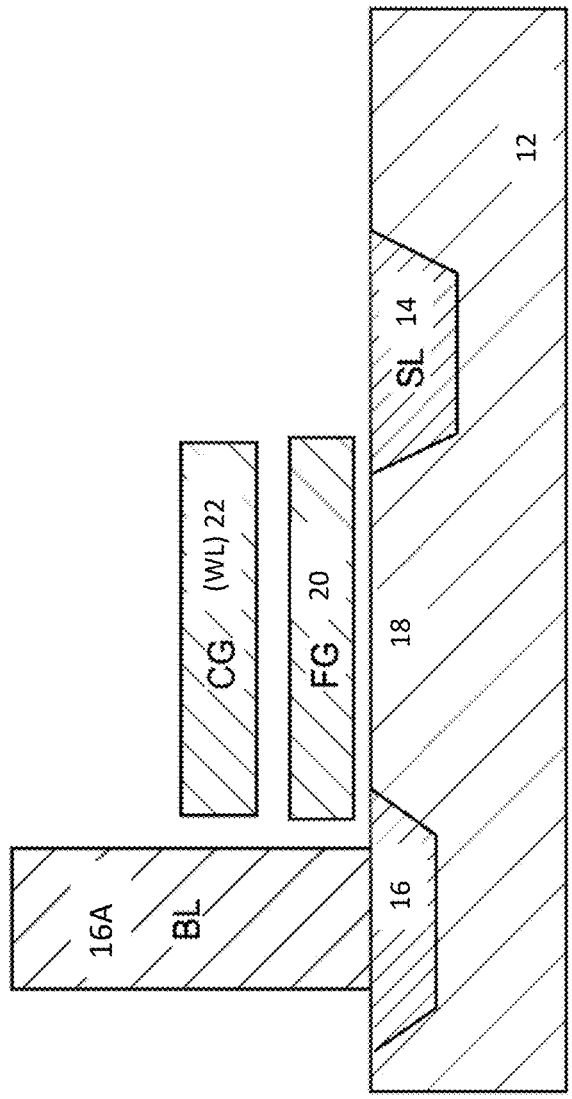
FIGURE 4
(PRIOR ART)
FIGURE 5
(PRIOR ART)

FIGURE 11

| | WL | WL-unsel | BL | BL-unsel | SL | SL-unsel |
|---|---|---|---|---|---|---|
| Read | 1-3.5V | -0.5V/0V | 0.6-2V (Ineuron) | 0.6V-2V/0V | 0V | 0V |
| Erase | ~5-13V | 0V | 0V | 0V | 0V | 0V |
| Program | 1-2V | -0.5V/0V | 0.1-3 uA | Vinh ~2.5V | 4-10V | 0-1V/FLT |

FIGURE 13

| | WL | WL-unsel | BL | BL-unsel | SL | SL-unsel |
|---|---|---|---|---|---|---|
| Read | 1-3.5V | -0.5V/0V | 0.6-2V | 0.6V-2V/0V | ~0.3-1V (Ineuron) | 0V |
| Erase | ~5-13V | 0V | 0V | 0V | 0V | SL-inhibit (~4-8V) |
| Program | 1-2V | -0.5V/0V | 0.1-3 uA | Vinh ~2.5V | 4-10V | 0-1V/FLT |

FIGURE 15

|  | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2V | -0.5V/ 0V | 0.6-2V (Ineuron) | 0V | 0-2.6V | 0-2.6V | 0-2.6V | 0-2.6V | 0-2.6V | 0V | 0V |
| Erase | 0V | 0V | 0V | 0V | 0V | 0-2.6V | 0-2.6V | 5-12V | 0-2.6V | 0V | 0V |
| Program | 0.7-1V | -0.5V/ 0V | 0.1-1uA | Vinh (1-2V) | 4-11V | 0-2.6V | 0-2.6V | 4.5-5V | 0-2.6V | 4.5-5V | 0-1V |

FIGURE 17

| | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2V | -0.5V/ 0V | 0.6-2V (Ineuron) | 0V | 0-2.6V | 0-2.6V | 0-2.6V | 0-2.6V | 0-2.6V | 0V | 0V |
| Erase | 0V | 0V | 0V | 0V | 0V | CGINH (4-9V) | 0-2.6V | 5-12V | 0-2.6V | 0V | 0V |
| Program | 0.7-1V | -0.5V/ 0V | 0.1-1uA | Vinh (1-2V) | 4-11V | 0-2.6V | 0-2.6V | 4.5-5V | 0-2.6V | 4.5-5V | 0-1V |

FIGURE 22
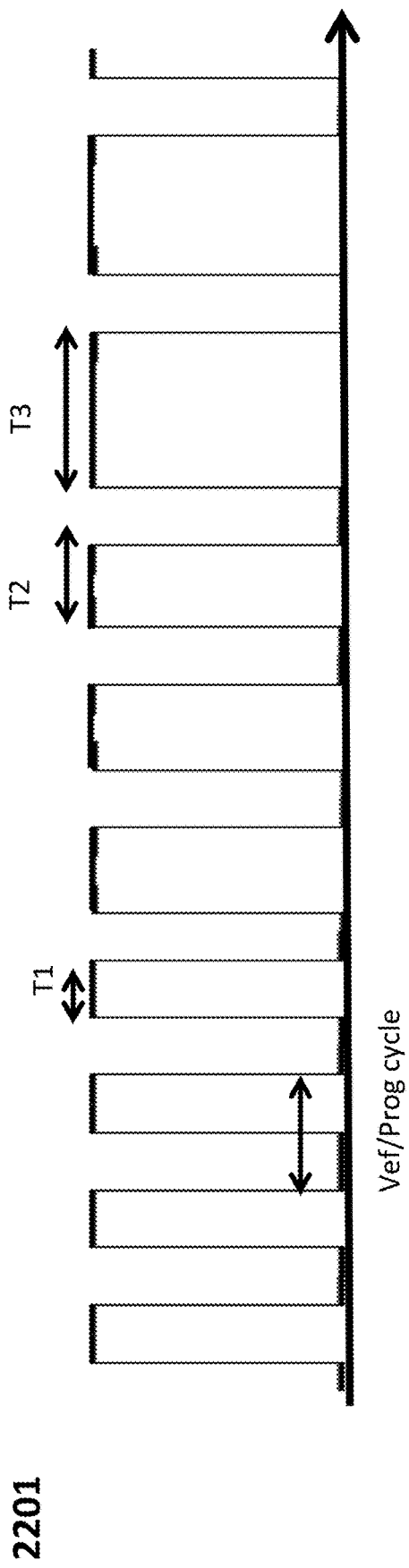
2201
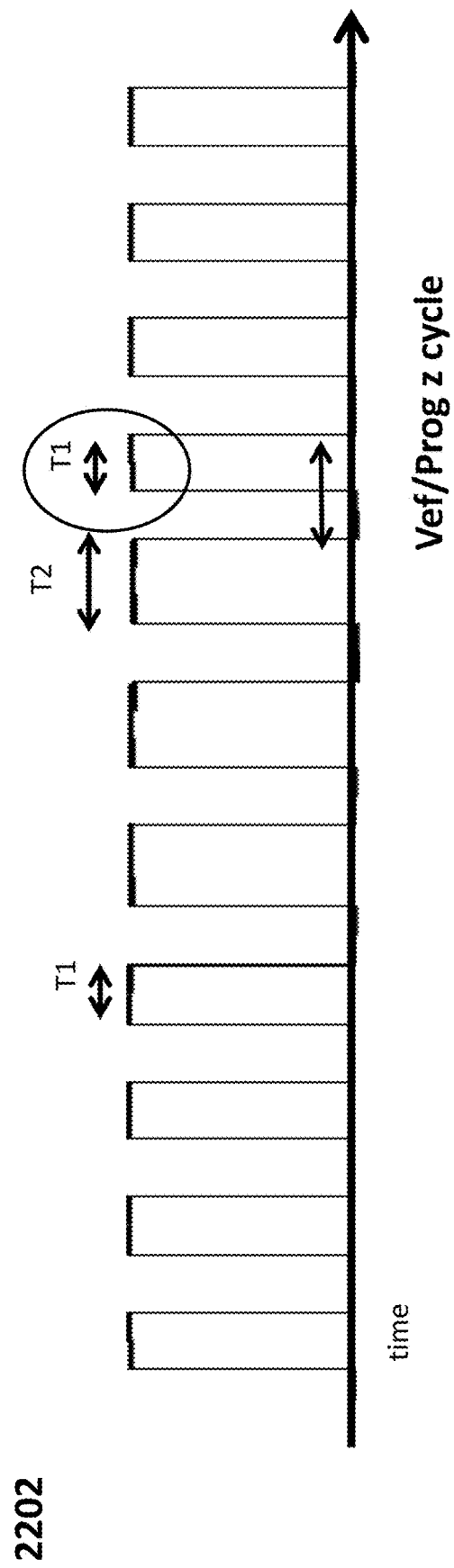
2202

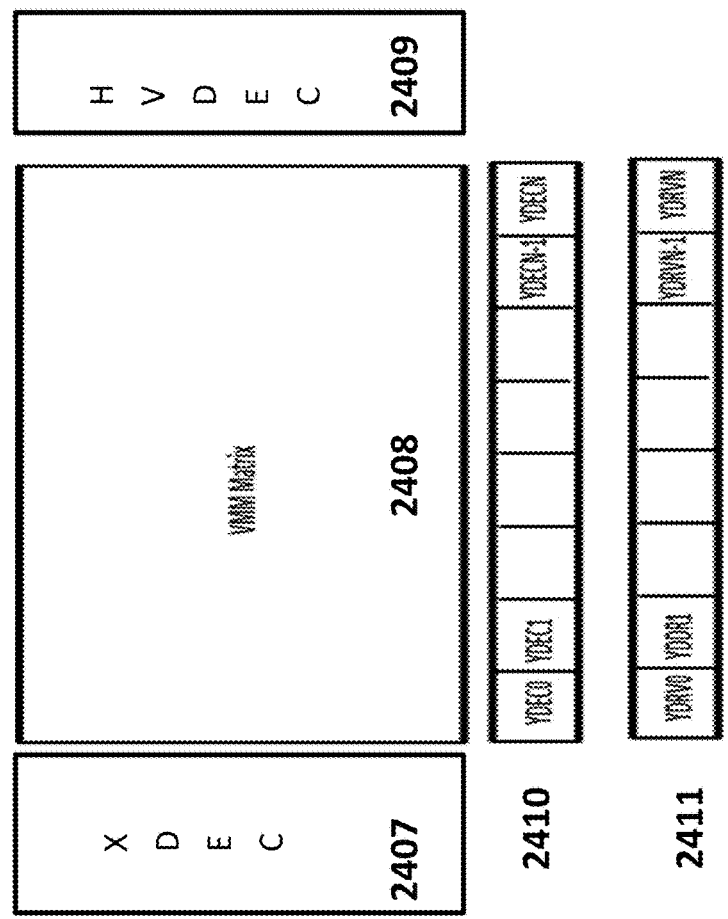
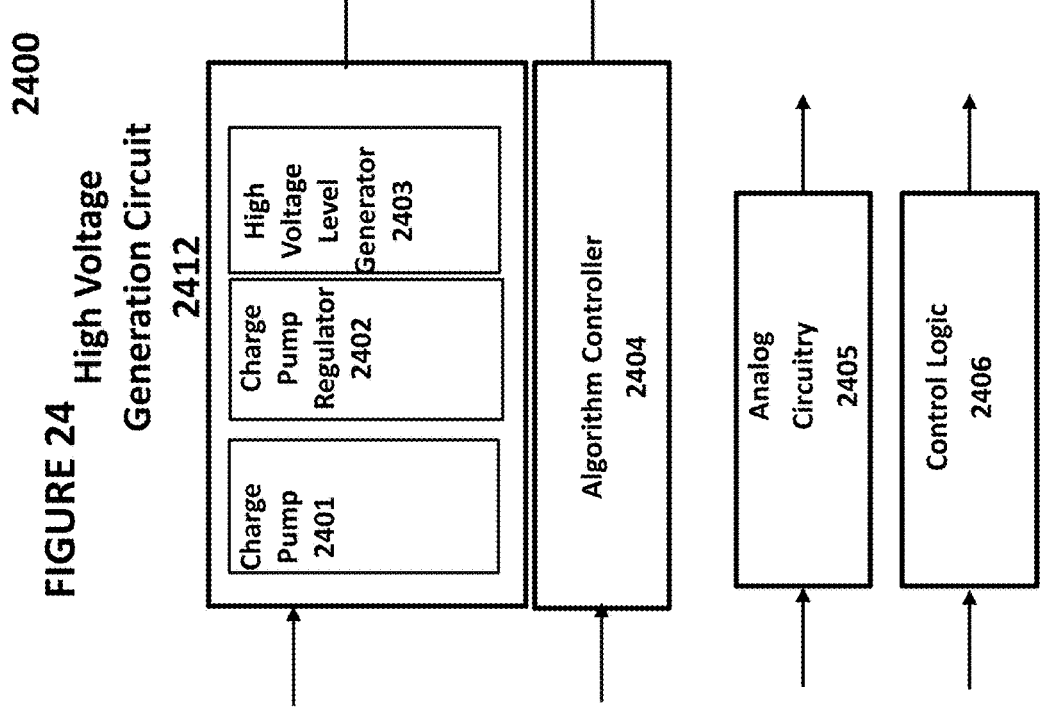
FIGURE 24

PROGRAMMING ANALOG NEURAL MEMORY CELLS IN DEEP LEARNING ARTIFICIAL NEURAL NETWORK

PRIORITY CLAIMS

This application is a divisional of U.S. patent application Ser. No. 17/191,392, filed on Mar. 3, 2021, and titled "Programming Analog Neural Memory Cells in Deep Learning Artificial Neural Network, which is a divisional of U.S. patent application Ser. No. 16/550,253, filed on Aug. 25, 2019, titled "Current Compensation Block and Method for Programming Analog Neural Memory In Deep Learning Artificial Neural Network," and issued on Mar. 9, 2021 as U.S. Pat. No. 10,943,661, which is a divisional of U.S. patent application Ser. No. 16/042,972, filed on Jul. 23, 2018, titled "Method and Apparatus for High Voltage Generation for Analog Neural Memory in Deep Learning Artificial Neural Network," and issued on Dec. 31, 2019 as U.S. Pat. No. 10,522,226, which claims priority to U.S. Provisional Patent Application No. 62/665,359, filed on May 1, 2018, and titled "Method and Apparatus for High Voltage Generation for Analog Neural Memory in Deep Learning Artificial Neural Network," all of which are incorporated herein by reference.

FIELD OF THE INVENTION

Numerous embodiments are disclosed for a high voltage generation algorithm and system for generating high voltages necessary for a particular programming operation in analog neural memory used in a deep learning artificial neural network.

BACKGROUND OF THE INVENTION

Artificial neural networks mimic biological neural networks (e.g., the central nervous systems of animals, in particular the brain) which are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows, and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. patent application Ser. No. 15/594,439, which is incorporated by reference. The non-volatile memory arrays operate as analog neuromorphic memory. The neural network device includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs.

Each non-volatile memory cells used in the analog neuromorphic memory system must be erased and programmed to hold a very specific and precise amount of charge in the floating gate. For example, each floating gate must hold one of N different values, where N is the number of different weights that can be indicated by each cell. Examples of N include 16, 32, and 64.

One challenge in VMM systems is the fact that the amount of total voltage and total current required for a programming operation is constantly changing, as the number of cells being programmed changes as well as the relative amount of charge being stored in each cell. These extreme variations in voltage and current can result in drastic changes in operating temperature and energy consumption.

What is needed is a high voltage generation system that compensates for the changes in voltage and current needs of the system based on the number of cells to be programmed at any given time.

SUMMARY OF THE INVENTION

Numerous embodiments are disclosed for a high voltage generation algorithm and system for generating high voltages necessary for a particular programming operation in analog neural memory used in a deep learning artificial neural network. In one example, a method for programming a plurality of non-volatile memory cells in an array of non-volatile memory cells, comprises generating a high voltage, and programming a plurality of non-volatile memory cells in an array using the high voltage when a programming enable signal is asserted and providing a feedback loop to maintain the high voltage while programming the plurality of non-volatile memory cells.

BRIEF DESCRIPTION OF THE DRAWINGS

FIG. 2 is a cross-sectional side view of a conventional 2-gate non-volatile memory cell.

FIG. 3 is a cross-sectional side view of a conventional 4-gate non-volatile memory cell.

FIG. 4 is a side cross-sectional side view of conventional 3-gate non-volatile memory cell.

FIG. 5 is a cross-sectional side view of another conventional 2-gate non-volatile memory cell.

FIG. 11 depicts operating voltages to perform operations on the vector multiplier matrix of FIG. 10.

FIG. 13 depicts operating voltages to perform operations on the vector multiplier matrix of FIG. 12.

FIG. 15 depicts operating voltages to perform operations on the vector multiplier matrix of FIG. 14.

FIG. 17 depicts operating voltages to perform operations on the vector multiplier matrix of FIG. 216.

FIG. 22 depicts waveforms for the voltage applied during different programming embodiments.

FIG. 24 depicts a high voltage generation block for used with a vector multiplier matrix system.

DETAILED DESCRIPTION OF THE INVENTION

Figure 1:
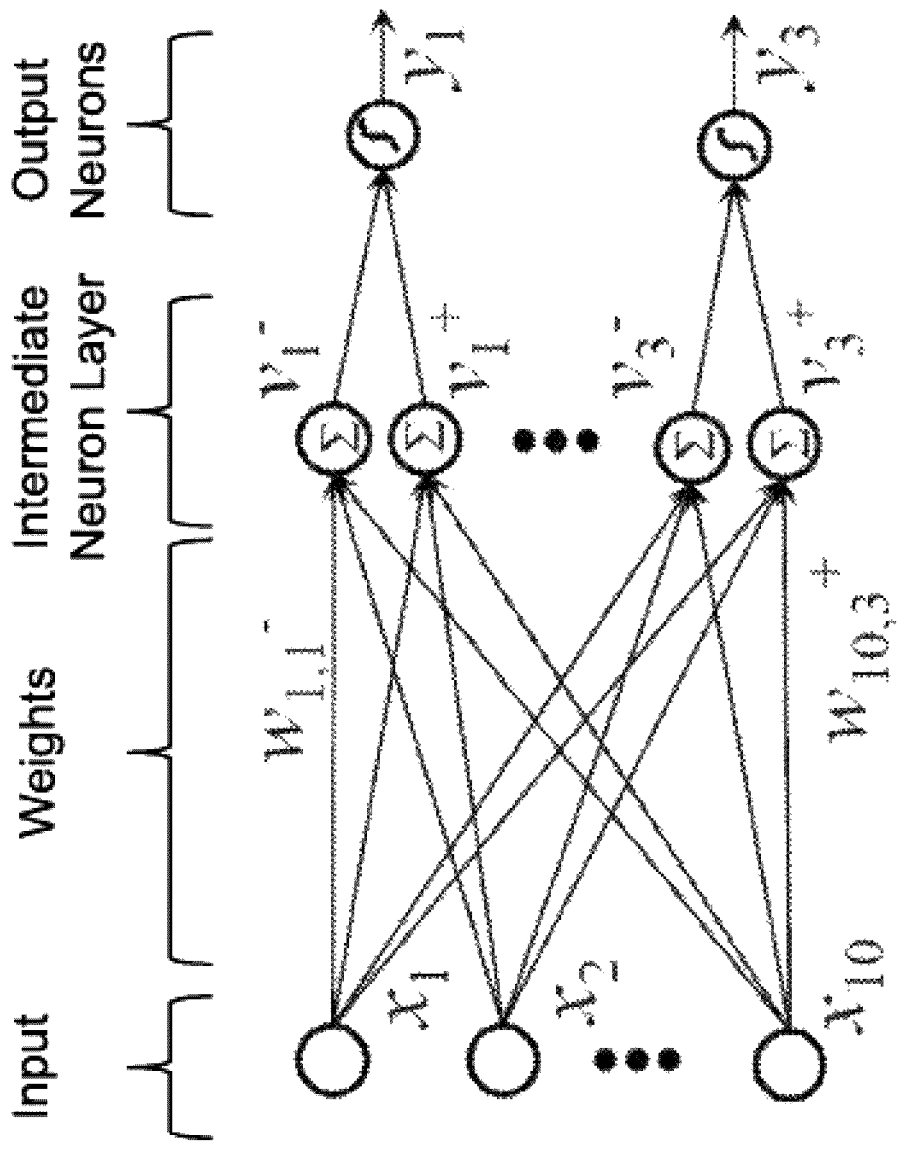
FIG. 1 is a diagram that illustrates an artificial neural network.

The artificial neural networks of the present invention utilize a combination of CMOS technology and non-volatile memory arrays.

Non-Volatile Memory Cells

Digital non-volatile memories are well known. For example, U.S. Pat. No. 5,029,130 ("the '130 patent") discloses an array of split gate non-volatile memory cells, and is incorporated herein by reference for all purposes. Such a memory cell is shown in FIG. 2. Each memory cell 210 includes source region 14 and drain region 16 formed in a semiconductor substrate 12, with a channel region 18 there between. A floating gate 20 is formed over and insulated from (and controls the conductivity of) a first portion of the channel region 18, and over a portion of the source region 16. A word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source 16. Electron current will flow from the source 16 towards the drain 14. The electrons will accelerate and become heated when they reach the gap between the word line terminal 22 and the floating gate 20. Some of the heated electrons will be injected through the gate oxide 26 onto the floating gate 20 due to the attractive electrostatic force from the floating gate 20.

Memory cell 210 is read by placing positive read voltages on the drain 14 and word line terminal 22 (which turns on the channel region under the word line terminal). If the floating gate 20 is positively charged (i.e. erased of electrons and positively coupled to the drain 16 ), then the portion of the channel region under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage ranges that can be applied to the terminals of memory cell 210 for performing read, erase, and program operations:

TABLE NO. 1

Operation of Flash Memory Cell 210 of FIG. 2

|       | WL       | BL       | SL     |
|-------|----------|----------|--------|
| Read  | 2-3 V    | 0.6-2 V  | 0 V    |
| Erase | ~11-13 V | 0 V      | 0 V    |
| Program | 1-2 V  | 1-3 μA   | 9-10 V |

Other split gate memory cell configurations are known. For example, FIG. 3 depicts four-gate memory cell 310 comprising source region 14, drain region 16, floating gate 20 over a first portion of channel region 18, a select gate 28 (typically coupled to a word line) over a second portion of the channel region 18, a control gate 22 over the floating gate 20, and an erase gate 30 over the source region 14. This configuration is described in U.S. Pat. No. 6,747,310, which is incorporated herein by reference for all purposes). Here, all gates are non-floating gates except floating gate 20, meaning that they are electrically connected or connectable to a voltage source. Programming is shown by heated electrons from the channel region 18 injecting themselves onto the floating gate 20. Erasing is shown by electrons tunneling from the floating gate 20 to the erase gate 30.

Table No. 2 depicts typical voltage ranges that can be applied to the terminals of memory cell 310 for performing read, erase, and program operations:

TABLE NO. 2

Operation of Flash Memory Cell 310 of FIG. 3

|         | WL/SG    | BL      | CG      | EG      | SL      |
|---------|----------|---------|---------|---------|---------|
| Read    | 1.0-2 V  | 0.6-2 V | 0-2.6 V | 0-2.6 V | 0 V     |
| Erase   | -0.5 V/0 V | 0 V   | 0V/-8 V | 8-12 V  | 0 V     |
| Program | 0 V      | 1 μA    | 8-11 V  | 4.5-9 V | 4.5-5 V |

FIG. 4 depicts split gate three-gate memory cell 410. Memory cell 410 is identical to the memory cell 310 of FIG. 3 except that memory cell 410 does not have a separate control gate. The erase operation (erasing through erase gate) and read operation are similar to that of the FIG. 3 except there is no control gate bias. The programming operation also is done without the control gate bias, hence the program voltage on the source line is higher to compensate for lack of control gate bias.

Table No. 3 depicts typical voltage ranges that can be applied to the terminals of memory cell 410 for performing read, erase, and program operations:

TABLE NO. 3

Operation of Flash Memory Cell 410 of FIG. 4

|         | WL/SG      | BL      | EG      | SL    |
|---------|------------|---------|---------|-------|
| Read    | 0.7-2.2 V  | 0.6-2 V | 0-2.6 V | 0 V   |
| Erase   | -0.5 V/0 V | 0 V     | 11.5 V  | 0 V   |
| Program | 1 V        | 2-3 μA  | 4.5 V   | 7-9 V |

FIG. 5 depicts stacked gate memory cell 510. Memory cell 510 is similar to memory cell 210 of FIG. 2, except floating gate 20 extends over the entire channel region 18, and control gate 22 extends over floating gate 20, separated by an insulating layer. The erase, programming, and read operations operate in a similar manner to that described previously for memory cell 210.

Table No. 4 depicts typical voltage ranges that can be applied to the terminals of memory cell 510 for performing read, erase, and program operations:

TABLE NO. 4

Operation of Flash Memory Cell 510 of FIG. 5

|         | CG           | BL      | SL  | P-sub          |
|---------|--------------|---------|-----|----------------|
| Read    | 2-5 V        | 0.6-2 V | 0 V | 0 V            |
| Erase   | -8 to -10 V/0 V | FLT  | FLT | 8-10 V/15-20 V |
| Program | 8-12 V       | 3-5 V   | 0 V | 0 V            |

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cells in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapsis weights of the neural network.

Neural Networks Employing Non-Volatile Memory Cell Arrays

Figure 6:
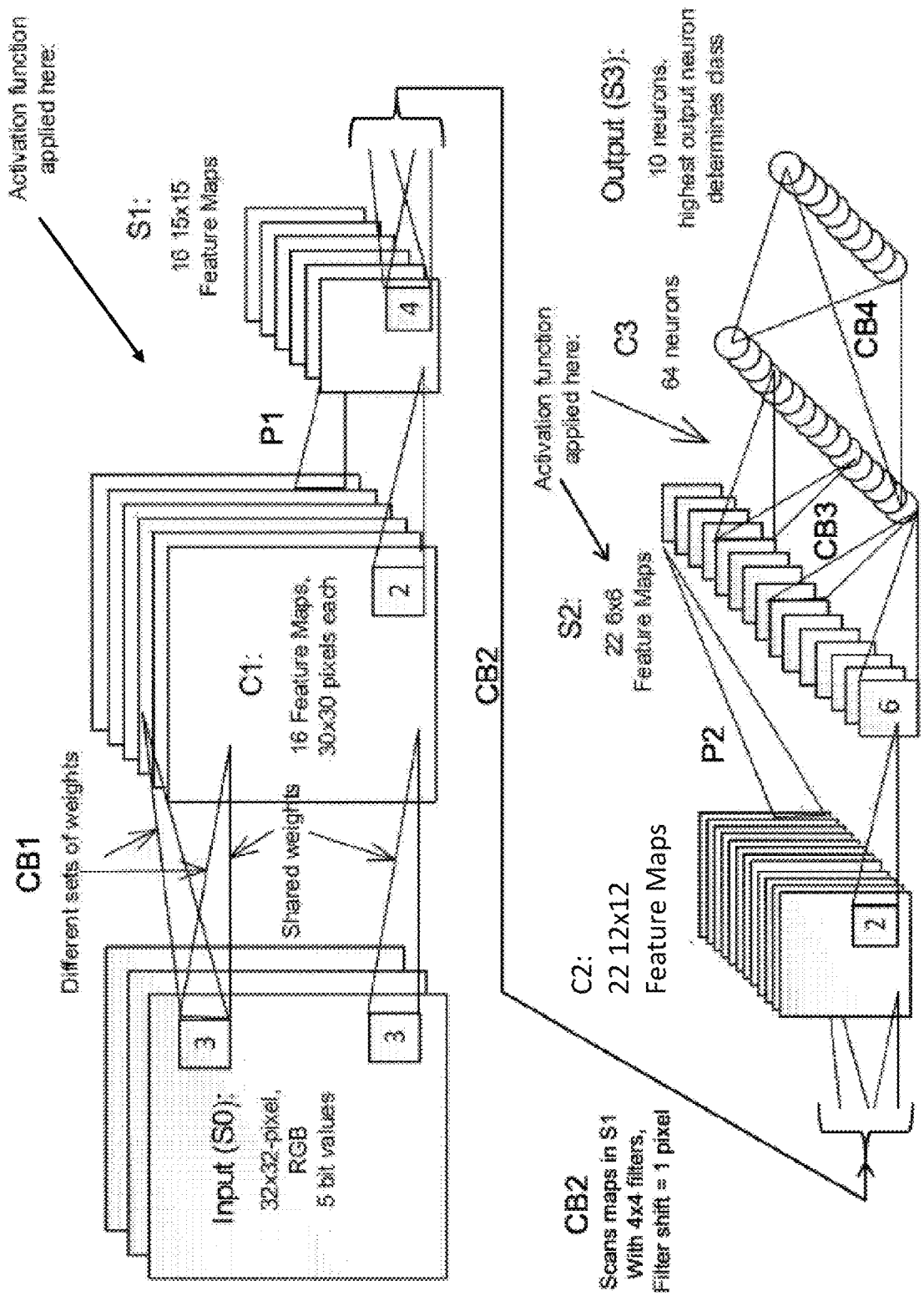
FIG. 6 is a diagram illustrating the different levels of an exemplary artificial neural network utilizing a non-volatile memory array.

FIG. 6 conceptually illustrates a non-limiting example of a neural network utilizing a non-volatile memory array. This example uses the non-volatile memory array neural net for a facial recognition application, but any other appropriate application could be implemented using a non-volatile memory array based neural network.

S0 is the input, which for this example is a 32×32 pixel RGB image with 5 bit precision (i.e. three 32×32 pixel arrays, one for each color R, G and B, each pixel being 5 bit precision). The synapses CB1 going from S0 to C1 have both different sets of weights and shared weights, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, whereby these 9 input values are multiplied by the appropriate weights and, after summing the outputs of that multiplication, a single output value is determined and provided by a first neuron of CB1 for generating a pixel of one of the layers of feature map C1. The 3×3 filter is then shifted one pixel to the right (i.e., adding the column of three pixels on the right, and dropping the column of three pixels on the left), whereby the 9 pixel values in this newly positioned filter are provided to the synapses CB1, whereby they are multiplied by the same weights and a second single output value is determined by the associated neuron. This process is continued until the 3×3 filter scans across the entire 32×32 pixel image, for all three colors and for all bits (precision values). The process is then repeated using different sets of weights to generate a different feature map of C1, until all the features maps of layer C1 have been calculated.

At C1, in the present example, there are 16 feature maps, with 30×30 pixels each. Each pixel is a new feature pixel extracted from multiplying the inputs and kernel, and therefore each feature map is a two dimensional array, and thus in this example the synapses CB1 constitutes 16 layers of two dimensional arrays (keeping in mind that the neuron layers and arrays referenced herein are logical relationships, not necessarily physical relationships—i.e., the arrays are not necessarily oriented in physical two dimensional arrays). Each of the 16 feature maps is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from C1 to S1, which pools values from consecutive, non-overlapping 2×2 regions in each feature map. The purpose of the pooling stage is to average out the nearby location (or a max function can also be used), to reduce the dependence of the edge location for example and to reduce the data size before going to the next stage. At S1, there are 16 15×15 feature maps (i.e., sixteen different arrays of 15×15 pixels each). The synapses and associated neurons in CB2 going from S1 to C2 scan maps in S1 with 4×4 filters, with a filter shift of 1 pixel. At C2, there are 22 12×12 feature maps. An activation function P2 (pooling) is applied before going from C2 to S2, which pools values from consecutive non-overlapping 2×2 regions in each feature map. At S2, there are 22 6×6 feature maps. An activation function is applied at the synapses CB3 going from S2 to C3, where every neuron in C3 connects to every map in S2. At C3, there are 64 neurons. The synapses CB4 going from C3 to the output S3 fully connects S3 to C3. The output at S3 includes 10 neurons, where the highest output neuron determines the class. This output could, for example, be indicative of an identification or classification of the contents of the original image.

Figure 7:
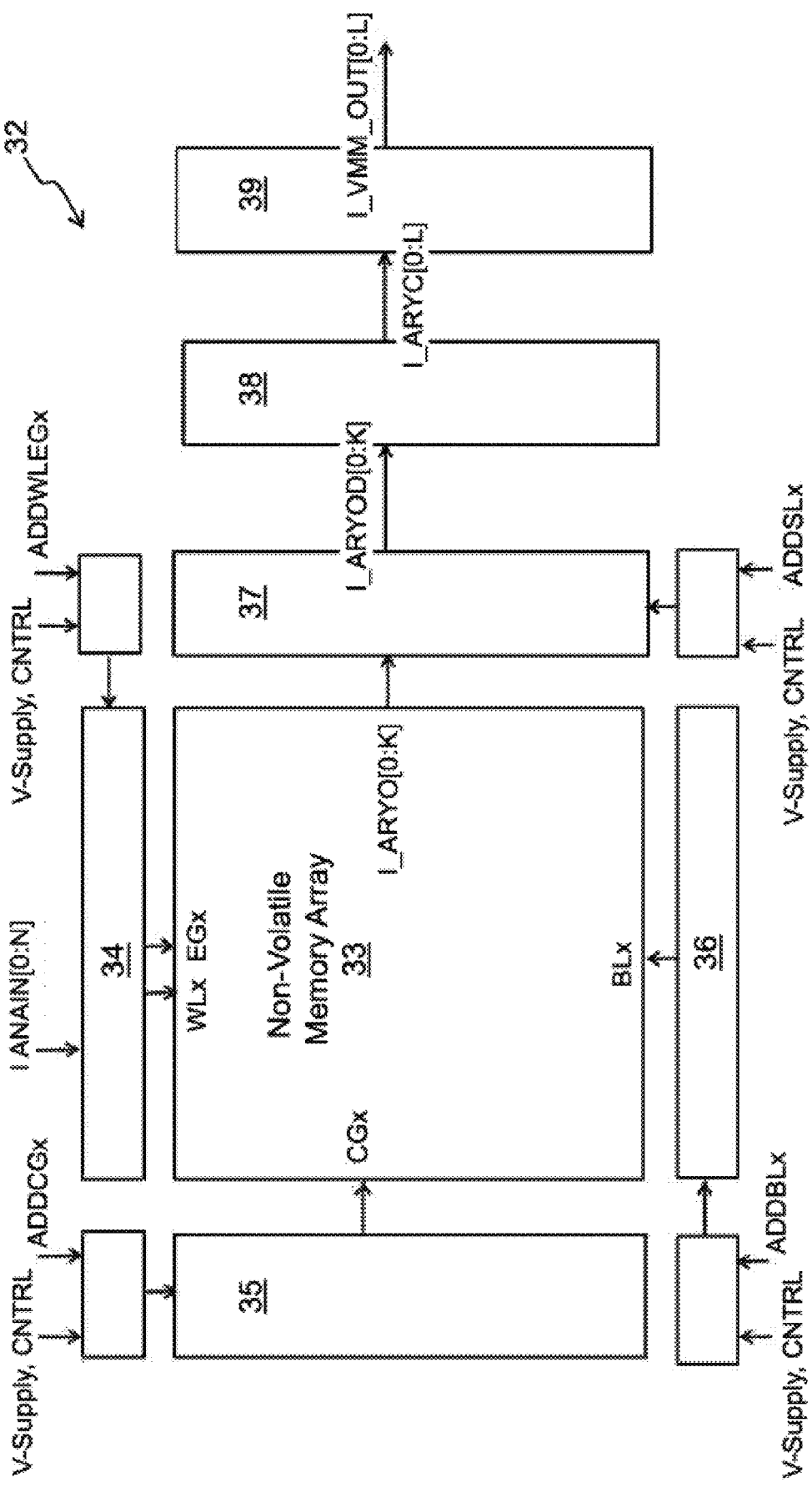
FIG. 7 is a block diagram illustrating a vector multiplier matrix.

Each level of synapses is implemented using an array, or a portion of an array, of non-volatile memory cells. FIG. 7 is a block diagram of the vector-by-matrix multiplication (VMM) array that includes the non-volatile memory cells, and is utilized as the synapses between an input layer and the next layer. Specifically, the VMM 32 includes an array of non-volatile memory cells 33, erase gate and word line gate decoder 34, control gate decoder 35, bit line decoder 36 and source line decoder 37, which decode the inputs for the memory array 33. Source line decoder 37 in this example also decodes the output of the memory cell array. Alternatively, bit line decoder 36 can decode the output of the memory array. The memory array serves two purposes. First, it stores the weights that will be used by the VMM. Second, the memory array effectively multiplies the inputs by the weights stored in the memory array and adds them up per output line (source line or bit line) to produce the output, which will be the input to the next layer or input to the final layer. By performing the multiplication and addition function, the memory array negates the need for separate multiplication and addition logic circuits and is also power efficient due to in-situ memory computation.

The output of the memory array is supplied to a differential summer (such as summing op-amp or summing current mirror) 38, which sums up the outputs of the memory cell array to create a single value for that convolution. The differential summer is such as to realize summation of positive weight and negative weight with positive input. The summed up output values are then supplied to the activation function circuit 39, which rectifies the output. The activation function may include sigmoid, tanh, or ReLU functions. The rectified output values become an element of a feature map as the next layer (C1 in the description above for example), and are then applied to the next synapse to produce next feature map layer or final layer. Therefore, in this example, the memory array constitutes a plurality of synapses (which receive their inputs from the prior layer of neurons or from an input layer such as an image database), and summing op-amp 38 and activation function circuit 39 constitute a plurality of neurons.

Figure 8:
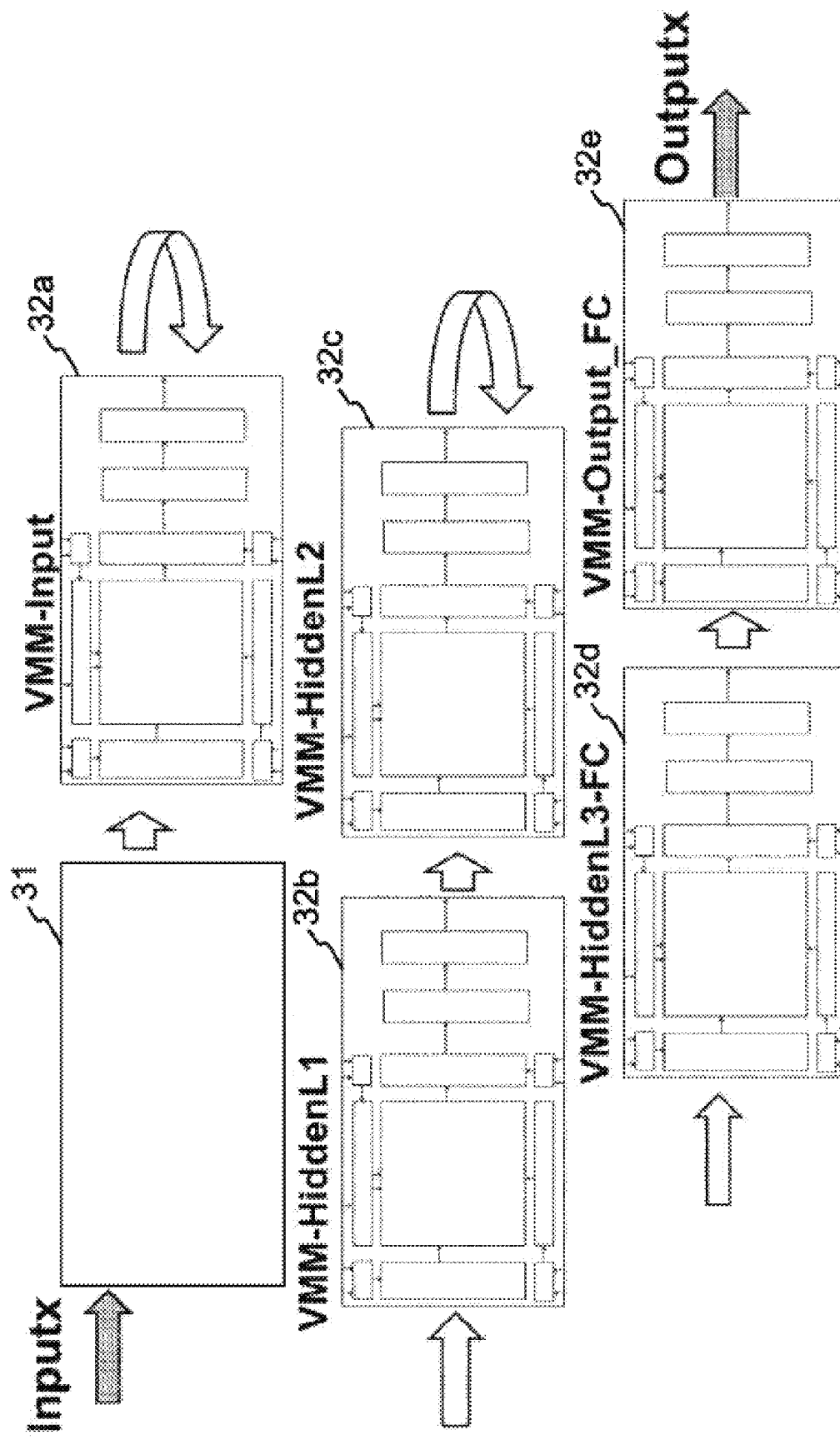
FIG. 8 is a block diagram illustrating various levels of a vector multiplier matrix.

FIG. 8 is a block diagram of the various levels of VMM. As shown in FIG. 8, the input is converted from digital to analog by digital-to-analog converter 31, and provided to input VMM 32a. The converted analog inputs could be voltage or current. The input D/A conversion for the first layer could be done by using a function or a LUT (look up table) that maps the inputs to appropriate analog levels for the matrix multiplier. The input conversion could also be done by an A/A Converter to convert an external analog input to a mapped analog input to the VMM. The output generated by the input VMM 32a is provided as an input to the next VMM (hidden level 1) 32b, which in turn generates an output that is provided as an input to the next VMM (hidden level 2) 32b, and so on. The various layers of VMM's 32 function as different layers of synapses and neurons of a convolutional neural network (CNN). Each VMM can be a stand-alone non-volatile memory array, or multiple VMMs could utilize different portions of the same non-volatile memory array, or multiple VMMs could utilize overlapping portions of the same non-volatile memory array. The example shown in FIG. 8 contains five layers (32a, 32b, 32c, 32d, 32e): one input layer (32a), two hidden layers (32b, 32c), and two fully connected layers (32d, 32e). One of ordinary skill in the art will appreciate that this is merely exemplary and that a system instead could comprise more than two hidden layers and more than two fully connected layers.

Vector-by-Matrix Multiplication (VMM) Arrays

Figure 9:
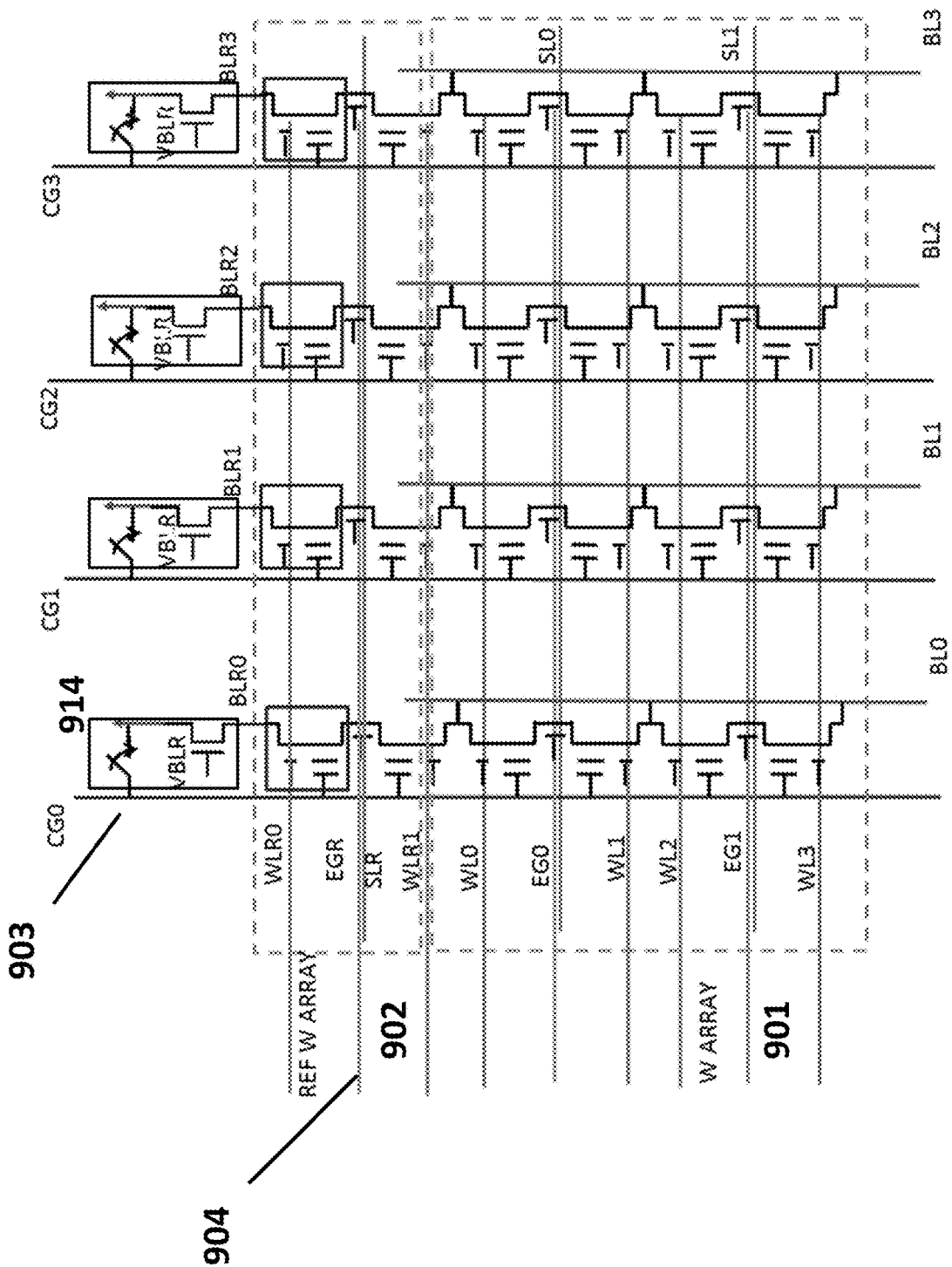
FIG. 9 depicts another embodiment of a vector multiplier matrix.

FIG. 9 depicts neuron VMM 900, which is particularly suited for memory cells of the type shown in FIG. 3, and is utilized as the synapses and parts of neurons between an input layer and the next layer. VMM 900 comprises a memory array 901 of non-volatile memory cells and reference array 902 (at the top of the array). Alternatively, another reference array can be placed at the bottom. In VMM 900, control gates line such as control gate line 903 run in a vertical direction (hence reference array 902 in the row direction, orthogonal to the input control gate lines), and erase gate lines such as erase gate line 904 run in a horizontal direction. Here, the inputs are provided on the control gate lines, and the output emerges on the source lines. In one embodiment only even rows are used, and in another embodiment, only odd rows are used. The current placed on the source line performs a summing function of all the currents from the memory cells connected to the source line.

As described herein for neural networks, the flash cells are preferably configured to operate in sub-threshold region.

The memory cells described herein are biased in weak inversion:

$$Ids = Io * e^{(Vg-Vth)/kVt} = w * Io * e^{(Vg)/kVt}$$

$$w = e^{(-Vth)/kVt}$$

For an I-to-V log converter using a memory cell to convert input current into an input voltage:

$$Vg = k * Vt * \log[Ids/wp * Io]$$

For a memory array used as a vector matrix multiplier VMM, the output current is:

$$Iout = wa * Io * e^{(Vg)/kVt}, \text{ namely}$$

$$Iout = (wa/wp) * Iin = W * Iin$$

$$W = e^{(Vthp-Vtha)/kVt}$$

A wordline or control gate can be used as the input for the memory cell for the input voltage.

Alternatively, the flash memory cells can be configured to operate in the linear region:

$$Ids = \text{beta} * (Vgs-Vth) * Vds; \text{ beta} = u * Cox * W/L$$

$$W\alpha(Vgs-Vth)$$

For an I-to-V linear converter, a memory cell operating in the linear region can be used to convert linearly an input/output current into an input/output voltage.

Other embodiments for the ESF vector matrix multiplier are as described in U.S. patent application Ser. No. 15/826,345, which is incorporated by reference herein. A sourceline or a bitline can be used as the neuron output (current summation output).

Figure 10:
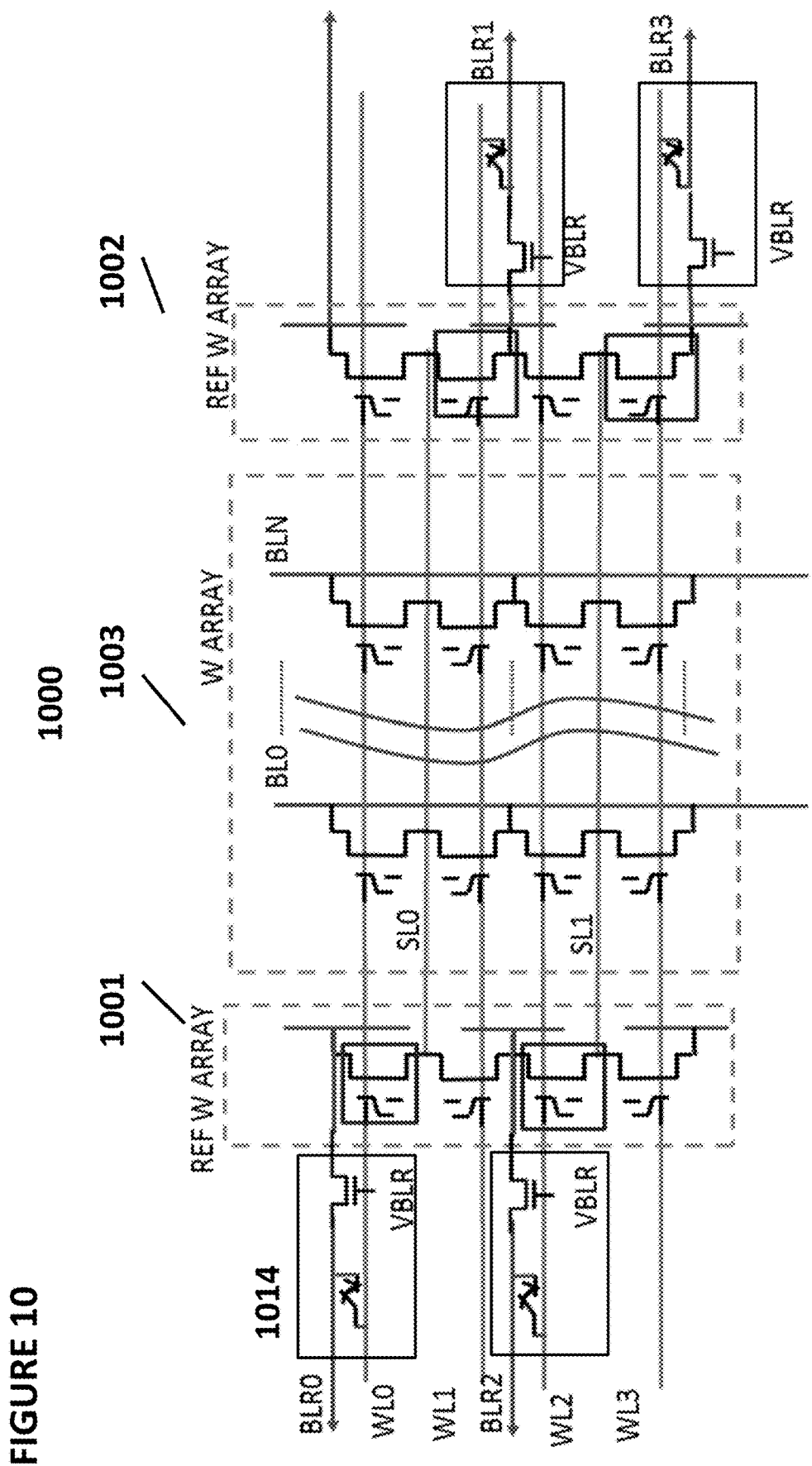
FIG. 10 depicts another embodiment of a vector multiplier matrix.

FIG. 10 depicts neuron VMM 1000, which is particularly suited for memory cells of the type shown in FIG. 2, and is utilized as the synapses between an input layer and the next layer. VMM 1000 comprises a memory array 1003 of non-volatile memory cells, reference array 1001, and reference array 1002. Reference arrays 1001 and 1002, in column direction of the array, serve to convert current inputs flowing into terminals BLR0-3 into voltage inputs WL0-3. In effect, the reference memory cells are diode connected through multiplexors with current inputs flowing into them. The reference cells are tuned (e.g., programmed) to target reference levels. The target reference levels are provided by a reference mini-array matrix. Memory array 1003 serves two purposes. First, it stores the weights that will be used by the VMM 1000. Second, memory array 1003 effectively multiplies the inputs (current inputs provided in terminals BLR0-3; reference arrays 1001 and 1002 convert these current inputs into the input voltages to supply to wordlines WL0-3) by the weights stored in the memory array and then add all the results (memory cell currents) to produce the output, which will be the input to the next layer or input to the final layer. By performing the multiplication and addition function, the memory array negates the need for separate multiplication and addition logic circuits and is also power efficient. Here, the voltage inputs are provided on the word lines, and the output emerges on the bit line during a read (inference) operation. The current placed on the bit line performs a summing function of all the currents from the memory cells connected to the bitline.

FIG. 11 depicts operating voltages for VMM 1000. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

Figure 12:
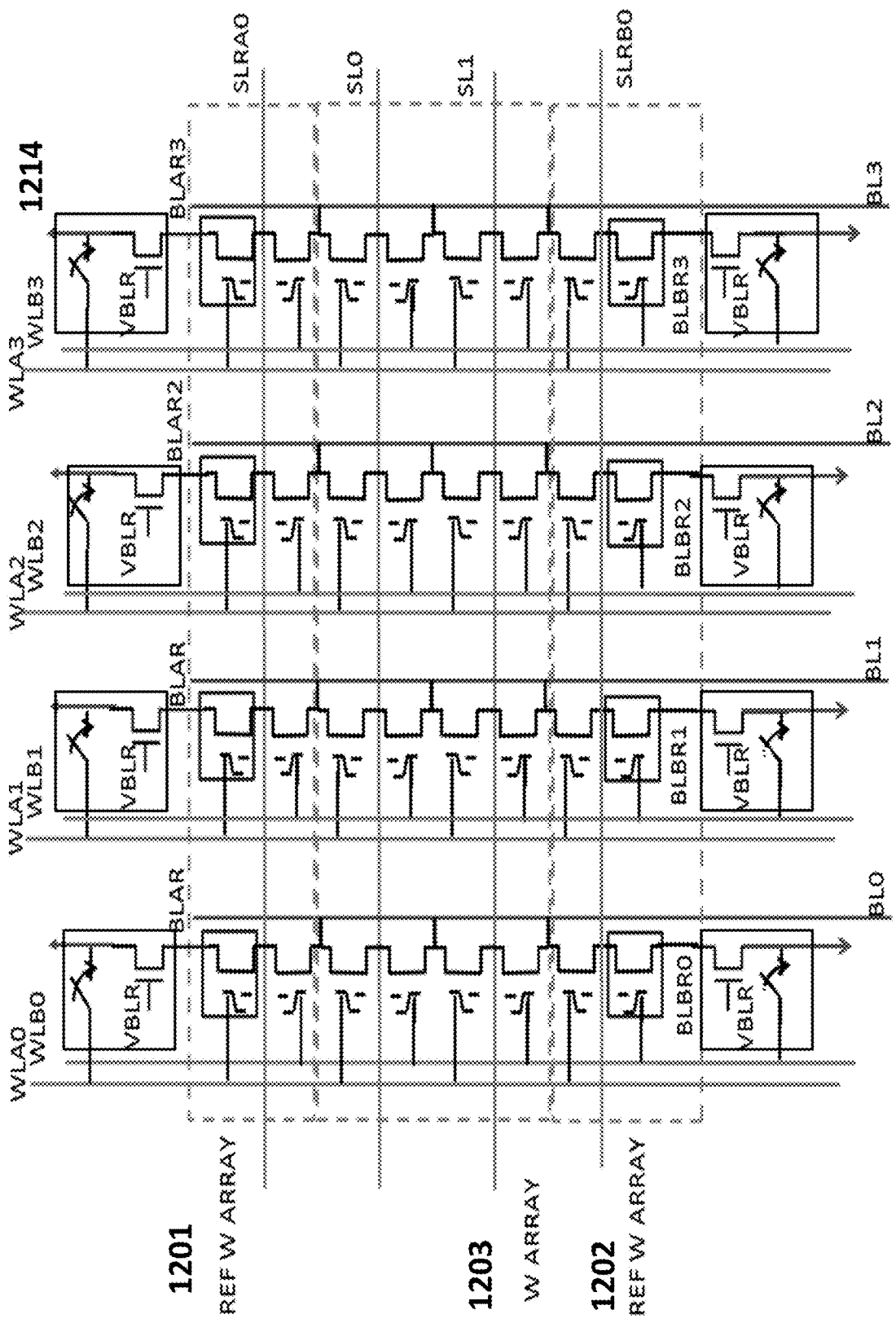
FIG. 12 depicts another embodiment of a vector multiplier matrix.

FIG. 12 depicts neuron VMM 1200, which is particularly suited for memory cells of the type shown in FIG. 2, and is utilized as the synapses and parts of neurons between an input layer and the next layer. VMM 1200 comprises a memory array 1203 of non-volatile memory cells, reference array 1201, and reference array 1202. The reference array 1201 and 1202 run in row direction of the array VMM 1200 is similar to VMM 1000 except that in VMM 1200 the word lines run in the vertical direction. Here, the inputs are provided on the word lines, and the output emerges on the source line during a read operation. The current placed on the source line performs a summing function of all the currents from the memory cells connected to the source line.

FIG. 13 depicts operating voltages for VMM 1200. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

Figure 14:
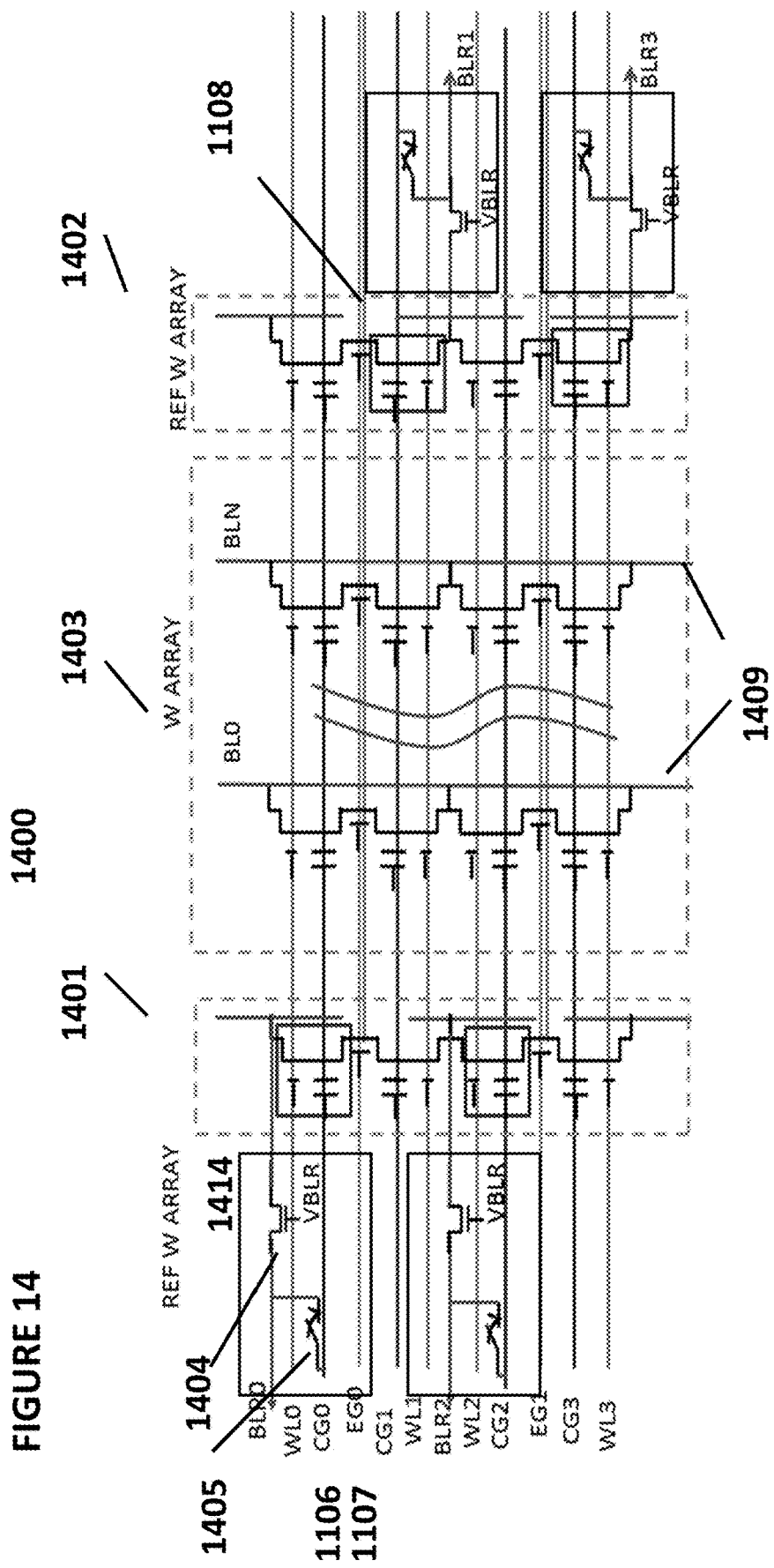
FIG. 14 depicts another embodiment of a vector multiplier matrix.

FIG. 14 depicts neuron VMM 1400, which is particularly suited for memory cells of the type shown in FIG. 3, and is utilized as the synapses and parts of neurons between an input layer and the next layer. VMM 1400 comprises a memory array 1403 of non-volatile memory cells, reference array 1401, and reference array 1402. The reference array 1401 and 1402 serves to convert current inputs flowing into terminals BLR0-3 into voltage inputs CG0-3. In effect, the reference memory cells are diode connected through cascoding mulitplexors 1414 with current inputs flowing into them. The mux 1414 includes a mux 1405 and a cascoding transistor 1404 to ensure a constant voltage on bitline of reference cells in read. The reference cells are tuned to target reference levels. Memory array 1403 serves two purposes. First, it stores the weights that will be used by the VMM 1400. Second, memory array 1403 effectively multiplies the inputs (current inputs provided to terminals BLR0-3; reference arrays 1401 and 1402 convert these current inputs into the input voltages to supply to the control gates CG0-3) by the weights stored in the memory array and then add all the results (cell currents) to produce the output, which will be the input to the next layer or input to the final layer. By performing the multiplication and addition function, the memory array negates the need for separate multiplication and addition logic circuits and is also power efficient. Here, the inputs are provided on the word lines, and the output emerges on the bitline during a read operation. The current placed on the bitline performs a summing function of all the currents from the memory cells connected to the bitline.

VMM 1400 implements uni-directional tuning for memory cells in memory array 1403. That is, each cell is erased and then partially programmed until the desired charge on the floating gate is reached. If too much charge is placed on the floating gate (such that the wrong value is stored in the cell), the cell must be erased and the sequence of partial programming operations must start over. As shown, two rows sharing the same erase gate need to be erased together (to be known as a page erase), and thereafter, each cell is partially programmed until the desired charge on the floating gate is reached, FIG. 15 depicts operating voltages for VMM 1400. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

Figure 16:
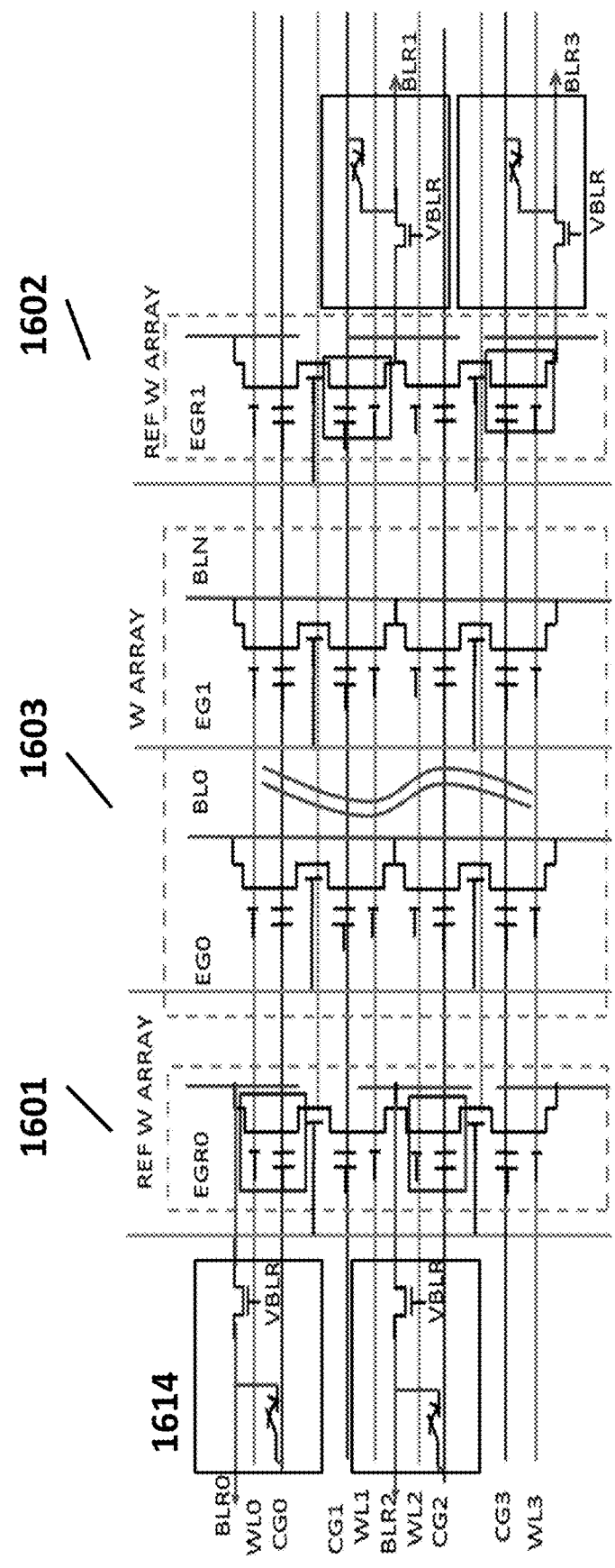
FIG. 16 depicts another embodiment of a vector multiplier matrix.

FIG. 16 depicts neuron VMM 1600, which is particularly suited for memory cells of the type shown in FIG. 3, and is utilized as the synapses and parts of neurons between an input layer and the next layer. VMM 1600 comprises a memory array 1603 of non-volatile memory cells, reference array 1601, and reference array 1602. EG lines are run vertically while CG and SL lines are run horizontally. VMM 1600 is similar to VMM 1400, except that VMM 1600 implements bi-directional tuning, where each individual cell can be completely erased, partially programmed, and partially erased as needed to reach the desired amount of charge on the floating gate. As shown, reference arrays 1601 and 1602 convert input current in the terminal BLR0-3 into control gate voltages CG0-3 (through the action of diode-connected reference cells through multiplexors) to be applied to the memory cells in the row direction. The current output (neuron) is in the bitline which sums all currents from the memory cells connected to the bitline.

FIG. 17 depicts operating voltages for VMM 1600. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

Figure 18:
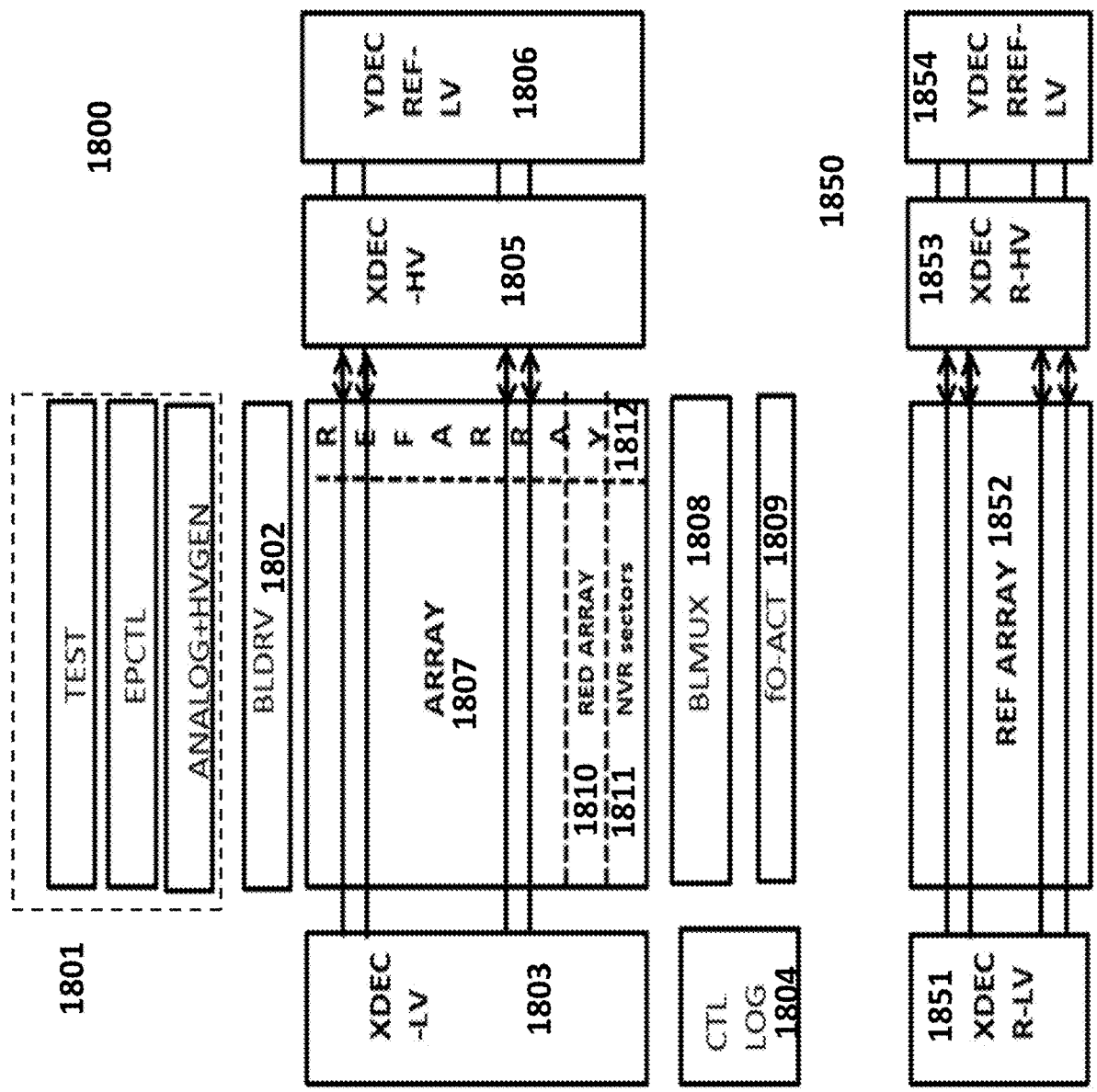
FIG. 18 depicts a memory system comprising a vector multiplier matrix.

FIG. 18 depicts VMM system 1800. VMM system 1800 comprises VMM array 1807, low voltage row decoder 1803, high voltage row decoder 1805, reference cell low voltage column decoder 1806 (shown for the reference array in the column direction, meaning providing input to output conversion in the row direction), bit line PE driver 1802, bit line multiplexor 1808, activation function circuit and summer 1809, control logic 1804, and analog bias circuit 1801.

Low voltage row decoder 1803 provides a bias voltage for read and program operations and provides a decoding signal for high voltage row decoder 1805. High voltage row decoder 1805 provides a high voltage bias signal for program and erase operations. Bit line PE driver 1801 provides controlling function for bit line in program, verify, and erase. Bias circuit 1801 is a shared bias block that provides the multiple voltages needed for the various program, erase, program verify, and read operations.

VMM system 1800 further comprises redundancy array 1810. Redundancy array 1810 provides array redundancy for replacing a defective array portion. VMM system 1800 further comprises NVR (non-volatile register, aka info sector) sectors 1811, which are array sectors used to store user info, device ID, password, security key, trimbits, configuration bits, manufacturing info, etc.

VMM system 1800 optionally comprises reference array 1812 and/or reference system 1850. Reference system 1850 comprises reference array 1852, reference array low voltage row decoder 1851, reference array high voltage row decoder 1853, and reference array low voltage column decoder 1854. The reference system can be shared across multiple VMM systems.

Reference array low voltage row decoder 1851 provides a bias voltage for read and programming operations involving reference array 1852 and also provides a decoding signal for reference array high voltage row decoder 1853. Reference array high voltage row decoder 1853 provides a high voltage bias for program and operations involving reference array 1852. Reference array low voltage column decoder 1854 provides a decoding function for reference array 1852. Reference array 1852 is such as to provide reference target for program verify or cell margining (searching for marginal cells).

Figure 19A:
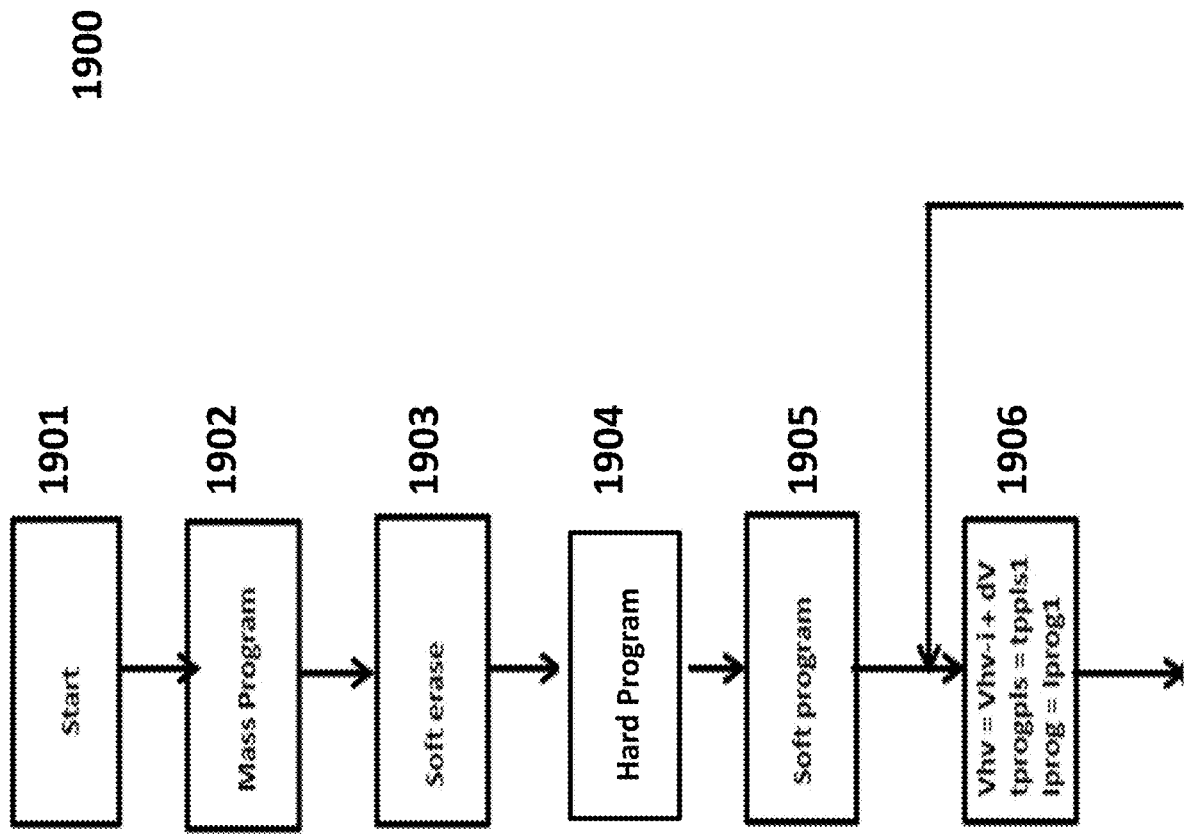
FIGS. 19A, 19B, and 19C depict an algorithm for programming one or more memory cells in a vector multiplier matrix.
Figure 19B:
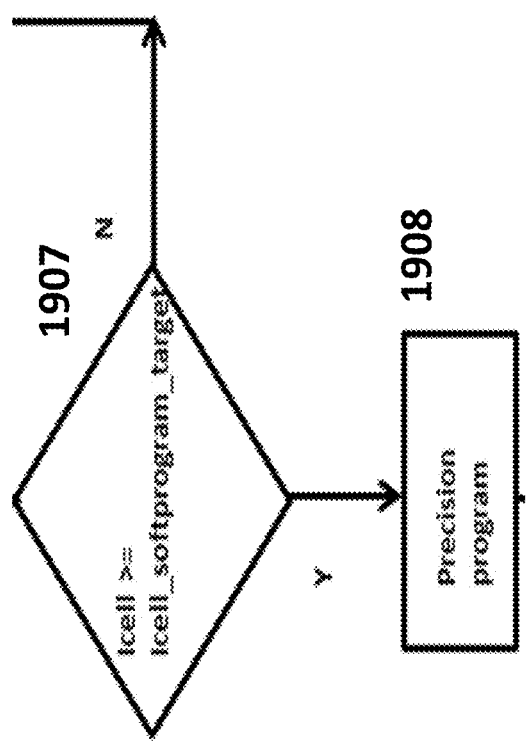
Figure 19C:
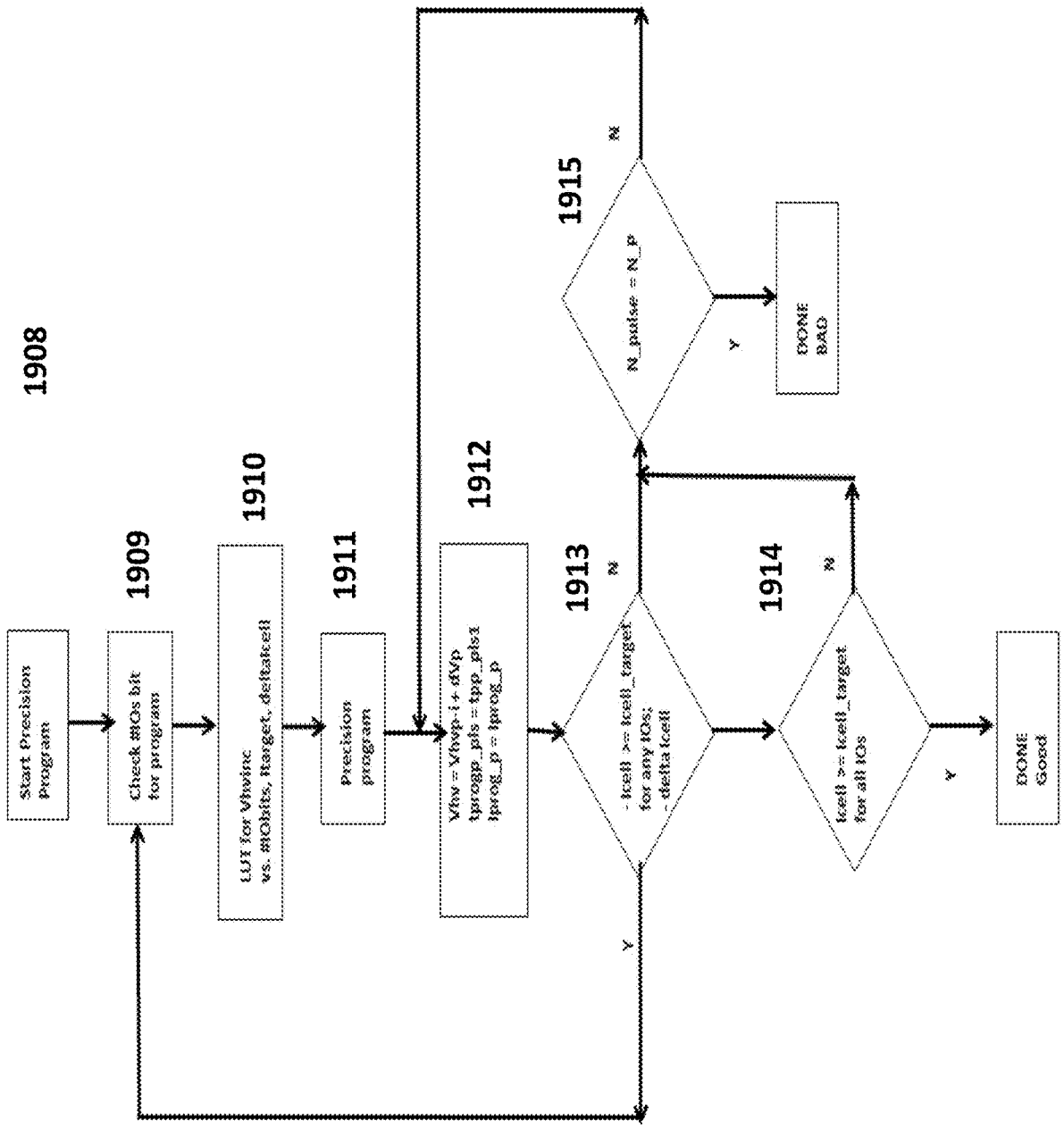
Figure 20:
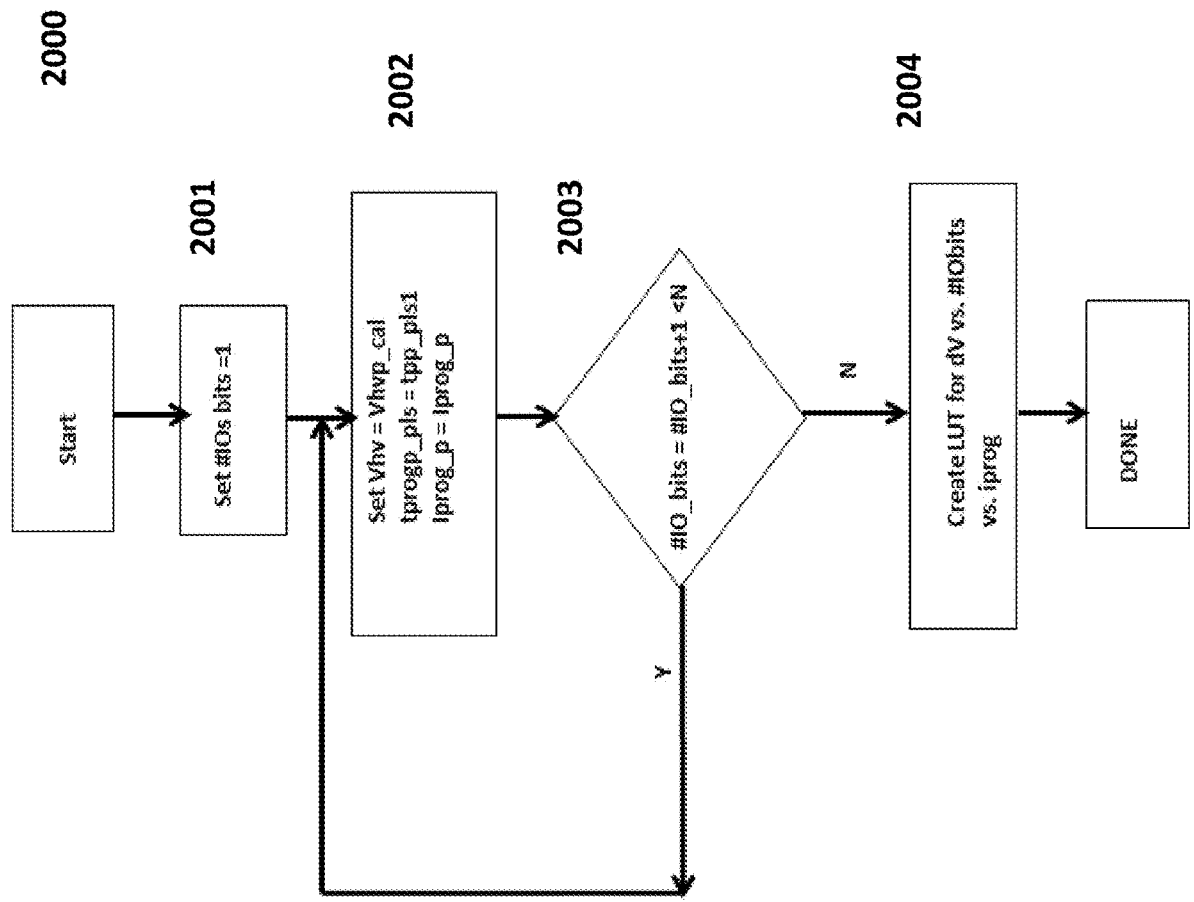
FIG. 20 depicts a calibration algorithm to generate a look-up table used during the programming of one or more memory cells in a vector multiplier matrix.

FIGS. 19A, 19B, and 19C depict programming method 1900. First, the method starts (step 1901), which typically occurs in response to a program command being received. Next, a mass program operation programs all cells to a '0' state (step 1902). Then a soft erase erases all cells to an intermediate weakly erased level of approximately 1-5 µA (step 1903). This is in contrast to a deep erase that would bring all cells to a fully erased state for digital application, e.g. ~20-30 uA cell current. Then, a hard program is performed on all unselected cells to remove charge from the cells (step 1904) for un-used cells to a very deep programmed state, ~fA-pA, to make sure that the cells are really off, meaning these memory cells are contributing insignificant current. A soft program is then performed on selected cells to remove some charge from the cells, to an n intermediate weakly programmed level of approximately 0.1-1.5 µA using a coarse algorithm (steps 1905, 1906, 1907). A coarse step program cycle followed by a verify operation occurs, where the charge on a select cells is compared to various threshold values in a coarse iterative fashion (steps 1906 and 1907). The coarse step program cycle includes a coarse voltage increment (such as high voltage level for SL, CG, and EG), and/or coarse program time, and/or coarse program current resulting in a coarse cell current change from one program step to the next.

Next, precision programming occurs (step 1908), where all selected cells are programmed to a target level within a range of 1 pA-20 nA depending on desired level by a fine step program algorithm. The system checks the number of bits to be programmed (step 1909). It determines using a LUT (look up table) or using an approximate function for Vhv(inc) for the number of bits to be programmed (step 1910). The Vhv is a high voltage such as a high voltage level for SL, CG, and EG, The LUT or a function is a function of #IOs to be programmed, the I target, and the delta Icell (=current Icell–previous Icell). It then performs precision programming steps (step 1911). A programming operation is performed (step 1912). A verification step (check Icell vs. Itarget and calculate/store delta Icell) is then performed (step 1913). If one or more cells are verified, then the process goes back to step 1909 to program the remaining cells. If not, a counter is checked, and if a threshold number of attempts have been made, then the process ends and the cells are deemed bad. If not, then the programming step 1912 is repeated. Once all the cells have been verified (step 1914), then the process is complete.

FIG. 2000 depicts a high voltage calibration process to build a look-up-table or generate a function to determine the desired voltage level required for programming for each possible number of bits to be programmed. The starting point is the situation where one bit is to be programmed (step 2001). A voltage (such as high voltage level for SL, CG, and EG) is determined for programming that one bit (step 2002).

Then the number of bits is incremented (step 2003), and the programming step is repeated (step 2001). Once the process has been performed for N bits (the total number of possible bits to be programmed), the values are programmed into a look-up-table (step 2004) to be consulted during programming operations.

Figure 21:
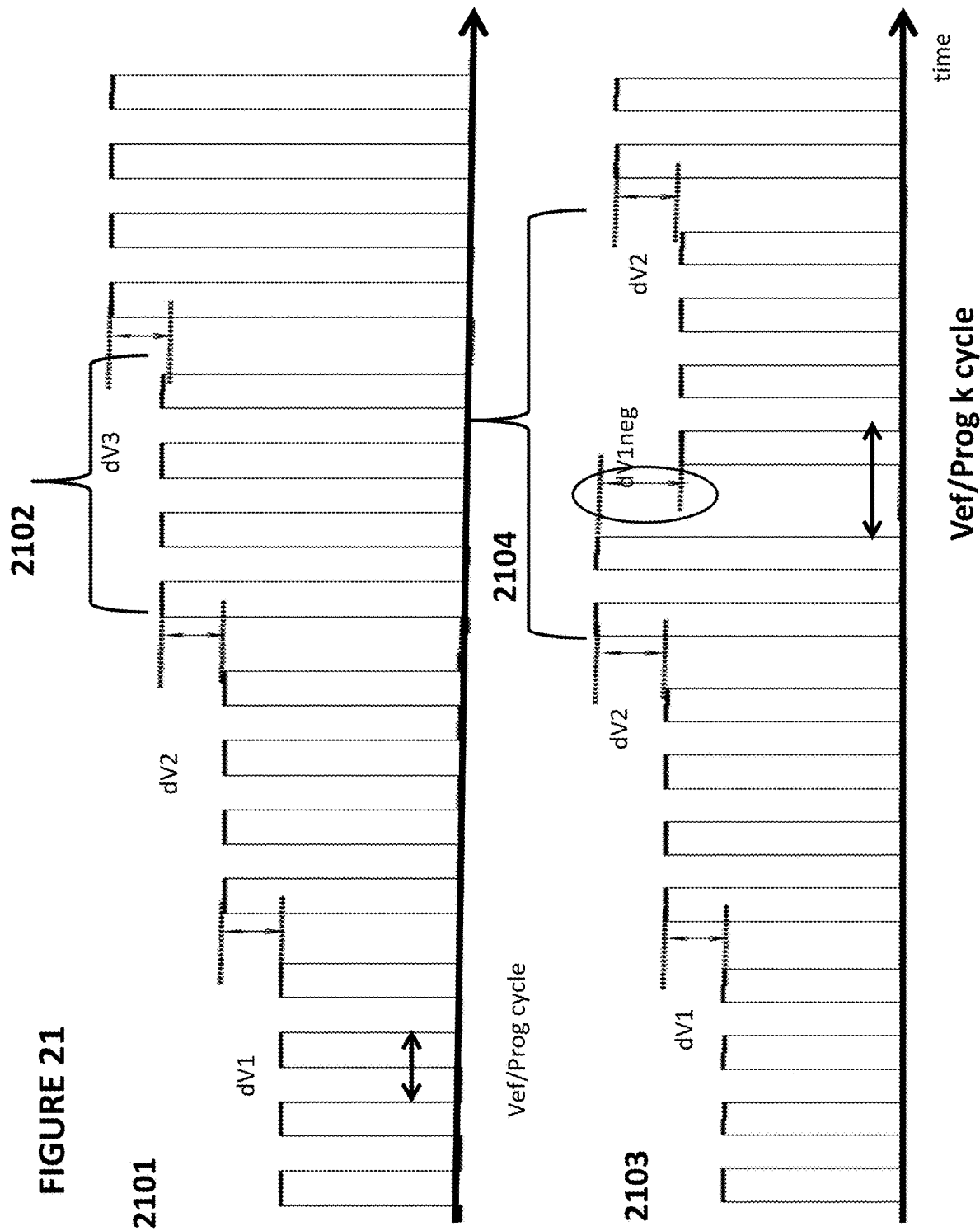
FIG. 21 depicts waveforms for the voltage applied during different programming embodiments.

FIG. 21 depicts two different approaches to programming operations. Each operation includes multiples of a Verify and Program (Vef/Prog) cycle. In the Verify cycle, the I target is checked and the number of IOs to be programmed is checked. The HV program level (such as high voltage level for SL, CG, and EG) is adjusted basing on the Itarget and the number of IOs to be programmed. In waveform 2101, the total voltage provided during a programming operation increases in magnitude as the number of bits to be programmed increases. Sequence 2101 represents the voltage provided, through four exemplary pulses, for the situation where three bits are to be programmed. By contrast, in waveform 2103 with HV level and program time adjustment per Vef/Prog cycle, two pulses of the same magnitude as in sequence 2101 are provided, but then as an example during Vef/Prog k cycle, less number of bits to be programmed, the magnitude decreases (e.g., dV1neg) and the lesser pulses are provided for a greater duration (i.e., four pulses of a lower magnitude in 2104 instead of two pulses of a higher magnitude in 2101 ). That is, the same result can be achieved with different combinations of voltage magnitude and duration of application of the pulses. The HV program level of the Vef/Prog k cycle is lowered to prevent overshoot the target in next programming cycle due to less bits to be programmed, meaning HV program level is higher for next cycle.

FIG. 22 depicts two additional approaches to programming operations. In waveform 2201, the total voltage provided during a programming operation stays the same in in magnitude but the length of each programming pulses increases as the number of bits to be programmed increases. In waveform 2201 with program pulsewidth time adjustment per Vef/Prog cycle, as an example during Vef/Prog z cycle, less number of bits to be programmed, instead of long pulses (as in the pulse of duration T3 in 2201), the pulses instead are shortened (T1) but are more pulses are applied so that the total duration is longer than in waveform 2201 for that particular programming level. The Vef/Prog z cycle is shortened to prevent overshoot the target in next programming cycle due to less bits to be programmed, meaning HV program level is higher for next cycle. That is, the same result can be achieved by varying either the duration of each pulses or the total duration of all of the pulses, with voltage magnitude remaining constant.

Another approach is to modulate voltage magnitude, pulse duration, and total duration of all pulses. Another approach is to modulate programming current instead of programming voltage or time.

Figure 23:
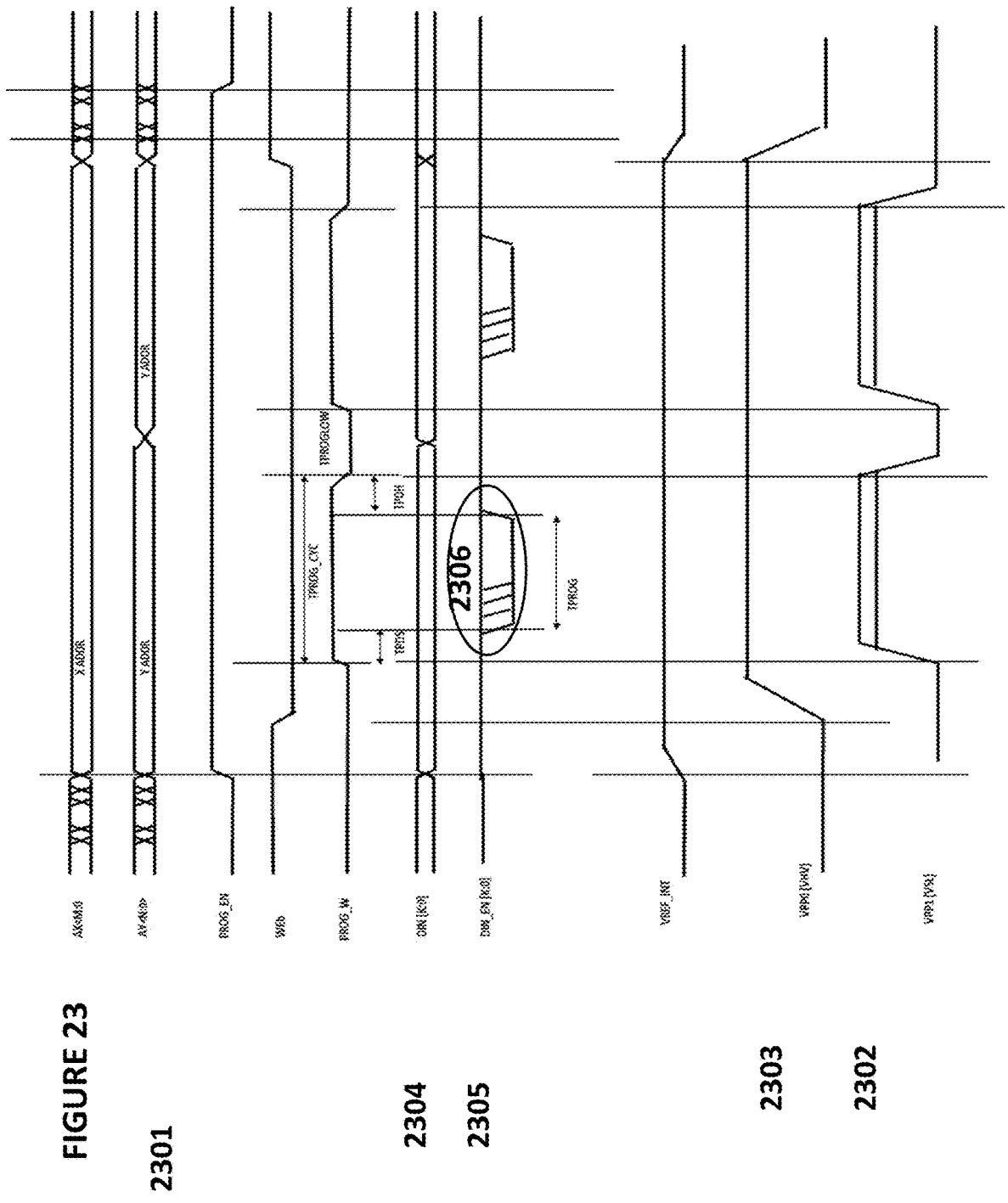
FIG. 23 depicts waveforms for the voltage applied during different programming embodiments.

FIG. 23 depicts waveforms for high voltage generation when multiple words of bits are to be programmed. Signal 2302 is an exemplary HV voltage (such as a high voltage level for SL, CG, and EG) applied to memory cell for programming. Signal 2304 is an exemplary datain [N:1], and its value controls the number of IO bits to be programmed. Signal 2305 controls the program pulsewidth individually for each IO. As shown in timing 2306, going low means enabling programming and going high means disabling programming. Signal 2305 depicts all IO bits going low on different falling edges but going high on the same rising edge. This is to ensure that during a program pulse, the internal high voltage level is going lower during the timing 2306 (as more bits are enabled to be programmed, leading to more current loading, meaning more IR drop during 2306 timing going from left to right as shown in timing 2306), to avoid possible program overshoot that would otherwise occur.

FIG. 24 depicts a block diagram of a VMM system 2400. The VMM system comprises VMM matrix 2408, row decoders 2407, high voltage decoders 2409, column decoders 2410, and bit line drivers 2411. VMM system 2400 further comprises high voltage generation block 2412, which comprises charge pump 2401, charge pump regulator 2402, and high voltage level generator 2403. VMM system 2400 further comprises algorithm controller 2404, analog circuitry 2405, and control logic 2406.

Figure 25:
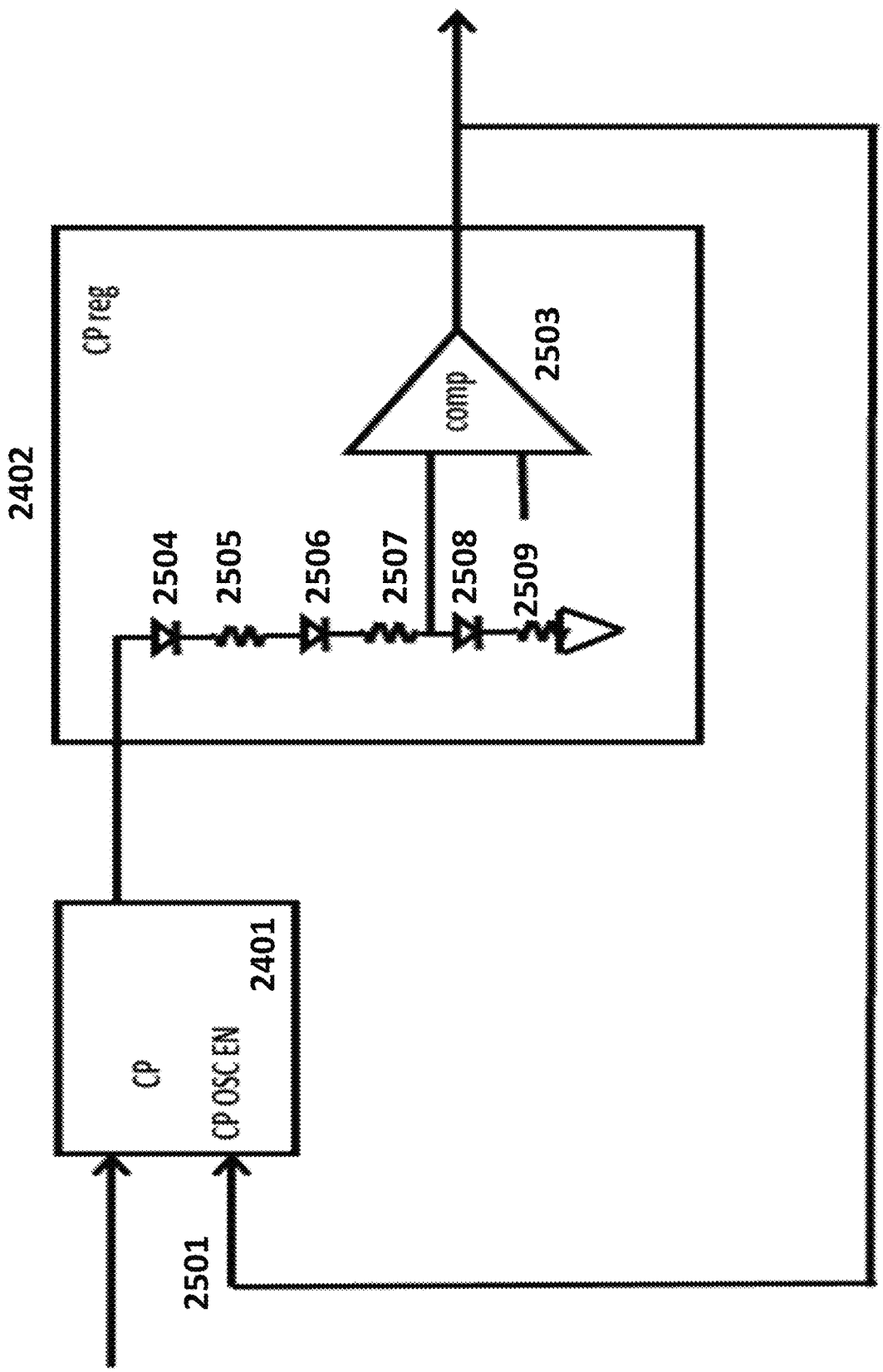
FIG. 25 depicts a charge pump and charge pump regulation circuit.

FIG. 25 provides further detail regarding charge pump 2401 and charge pump regulator 2402. Charge pump 2401 is controlled by enable signal 2501. When enable signal 2501 is not asserted, charge pump 2401 continues increasing the voltage of its output. When enable signal 2501 is asserted, charge pump 2401 maintains the voltage level of its output. Charge pump regulator 2402 comprises a series of diodes 2504, 2506, and 2508 and resistors 2505, 2507, and 2509. A node within that structure is input to comparator 2503, which receives another input comprising a voltage reference. When the voltage output from charge pump 2401 is sufficient to activate diodes 2504, 2506, and 2508, then current will flow into comparator 2503, and the enable signal will be asserted. Thus, charge pump regulator 2404 controls charge pump 2401 until the desired voltage level is achieved, which is based on the characteristics of diodes 2504, 2506, and 2508 and resistors 2505, 2507, and 2509.

Figure 26:
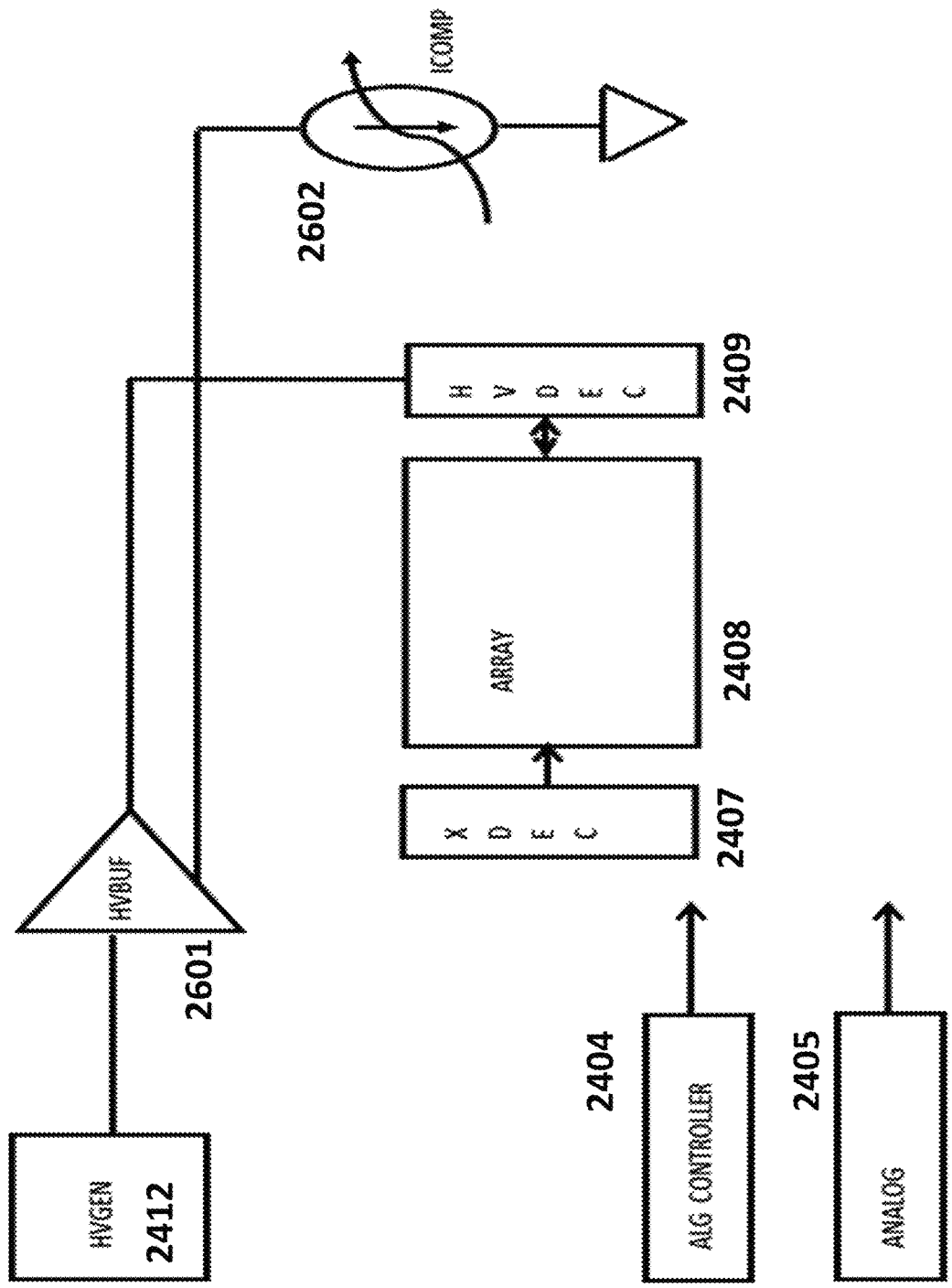
FIG. 26 depicts a high voltage generation block with a current compensation circuit.

FIG. 26 depicts VMM system 2400 used with high voltage buffer 2601 and adjustable current sink 2602. High voltage generator block 2412 generates a voltage that is provided to high voltage buffer 2601, which in turn provides that voltage to high voltage decoder 2409 and adjustable current sink (program compensation current Icomp) 2602. The current drawn by adjustable current sink Icomp 2602 can be adjusted to, for example, induce a compensated voltage drop within high voltage buffer 2601 to compensate for the number of IOs to be programmed (e.g., dVout1/2/ . . . /32 drop for 1/2/ . . . /32 IOs to be programmed) and to reduce the temperature of high voltage buffer 2601. For example Icomp a (#IOs to be programmed) *Iprog*M. Iprog=cell programming current, M=multiplier factor due to memory cell hot carrier effect in program. The compensation Icomp is applied to maintain a constant high voltage output over varying output load.

Figure 27:
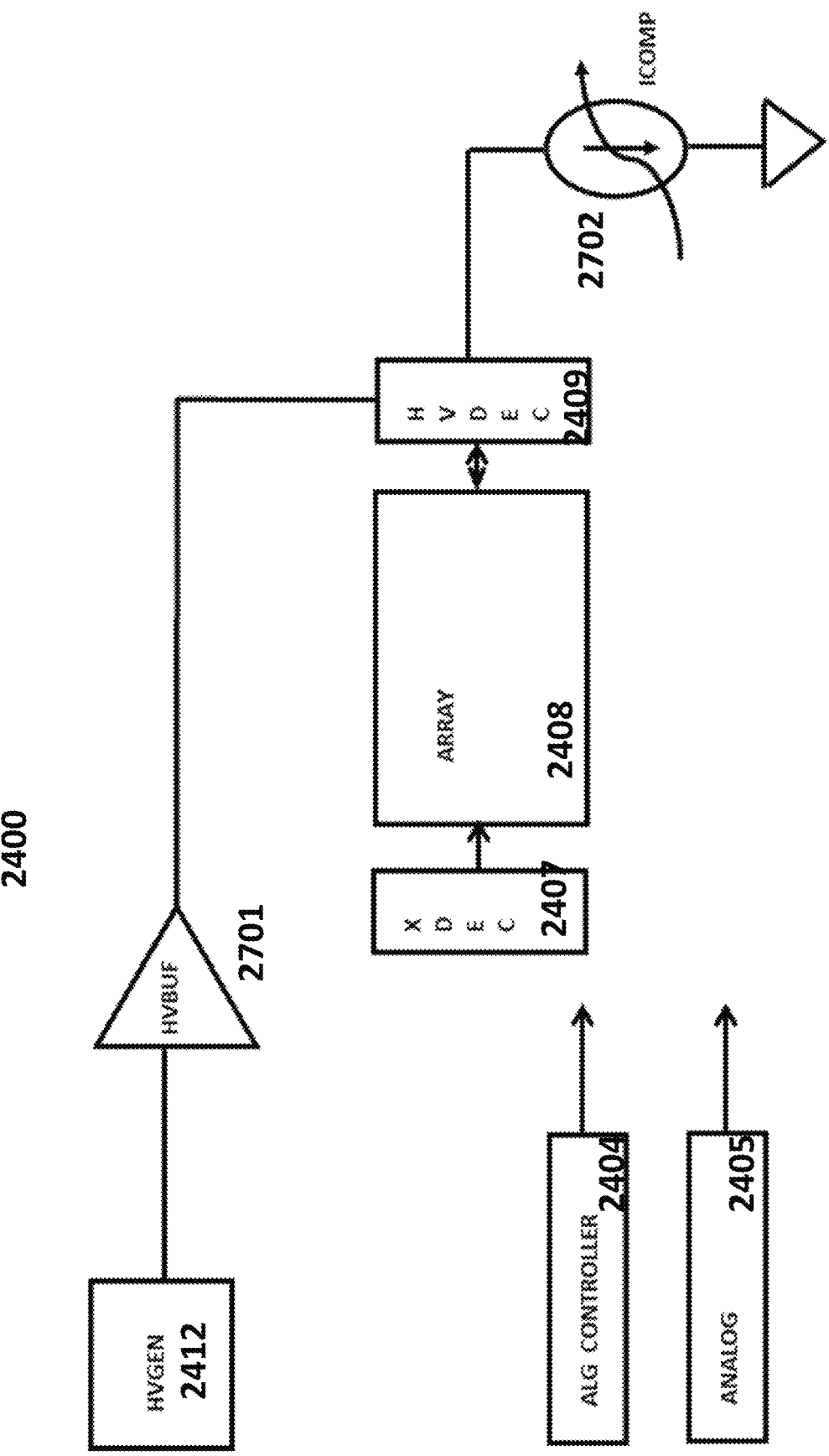
FIG. 27 depicts another high voltage generation block with a current compensation circuit.

FIG. 27 depicts VMM system 2400 used with high voltage buffer 2701 and adjustable current sink 2702. High voltage generator 2412 generates a voltage that is provided to high voltage buffer 2701, which in turn provides that voltage to high voltage decoder 2409. The current drawn by adjustable current sink (compensation current) Icomp 2702 can be adjusted to, for example, reduce the current drop (as a function of number of IOs to be programmed) within high voltage decoder 2409 to reduce the temperature of high voltage decoder 2409. For example Icomp α (#IOs to be programmed)*Iprog*M. Iprog=cell programming current, M=multiplier factor due to memory cell hot carrier effect in program. The compensation Icomp is applied to maintain a constant high voltage output over varying output load.

Figure 28:
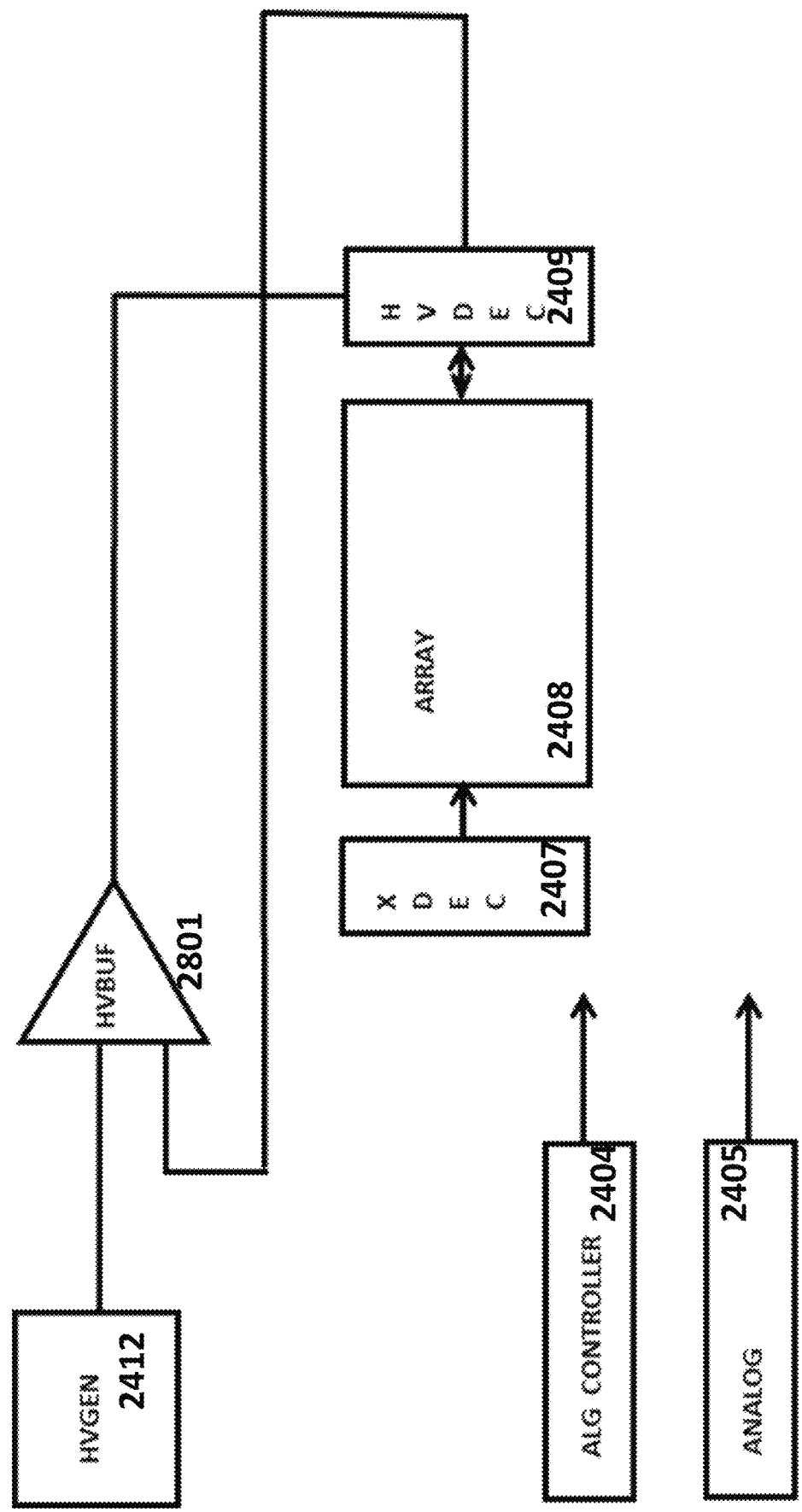
FIG. 28 depicts another high voltage generation block.

FIG. 28 depicts VMM system 2400 used with high voltage buffer 2801, which here is an operational amplifier. High voltage generator 2412 generates a voltage that is provided to high voltage buffer 2701, which in turn provides that voltage to high voltage decoder 2409. An output from high voltage decoder 2409 (e.g., the output is a feedback indicator of HV voltage in array) is provided as an input to high voltage buffer 2801, which then operates as a closed loop comparator. The closed loop compensation is applied to maintain a constant high voltage output over varying output load.

Figure 29:
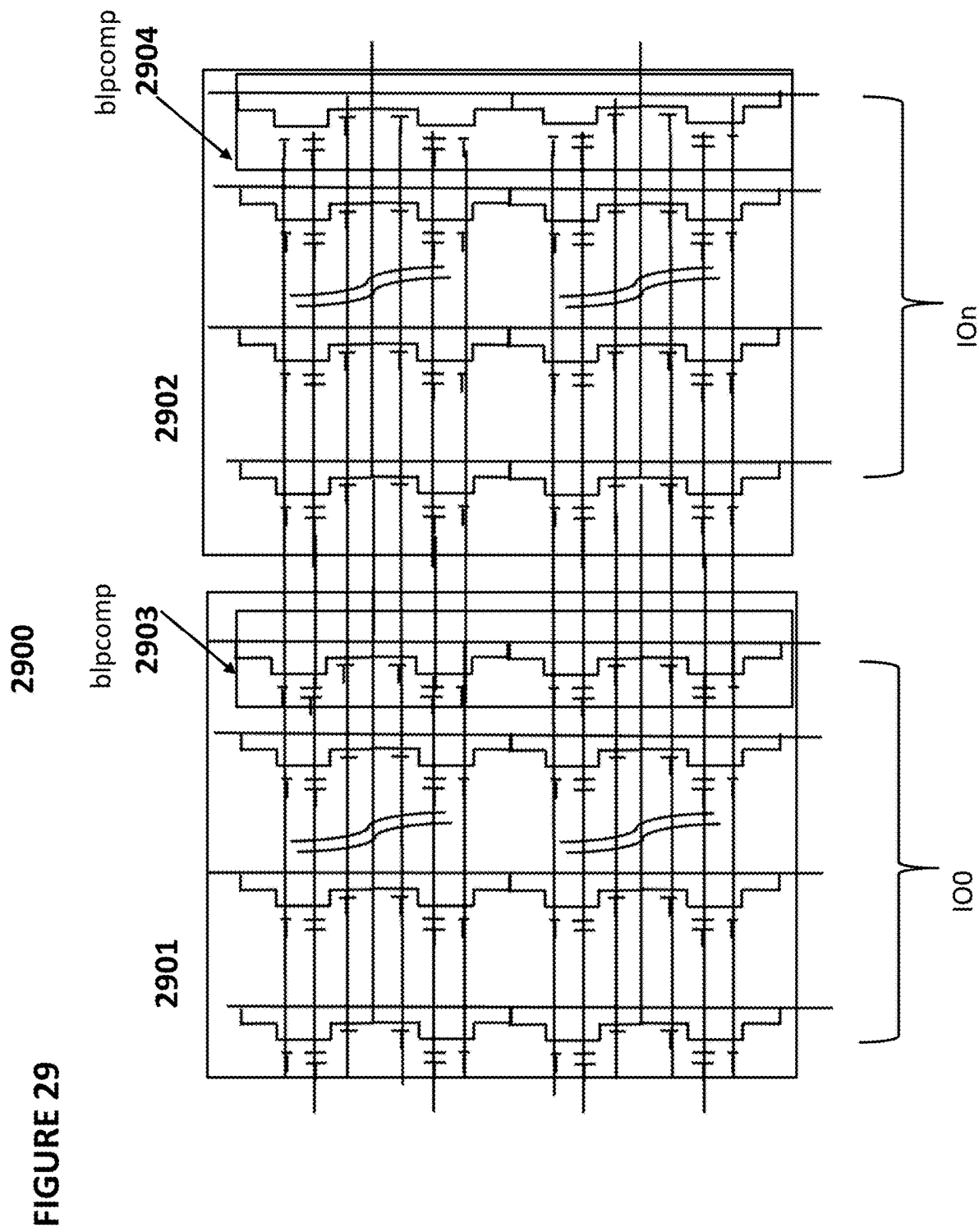
FIG. 29 depicts dummy bit lines for providing current compensation.

FIG. 29 depicts program current compensation block 2900 to be used in conjunction with VMM system 2400. Here, a dummy program bit line (programmable dummy array) is provided with each group of 32 bit lines. For example, group 2901 includes dummy bit line 2903, and group 2902 includes dummy bit line 2904. These dummy bitlines 2903 and 2904 can be turned on in instances where one or more other bits in groups 2901 and 2902, respectively, are not being programmed. This will keep the current drawn during a programming operation more constant than would be the case without the use of dummy bit lines 2903 and 2904. The program dummy array compensation scheme is applied to maintain a constant high voltage output over varying output load.

Figure 30:
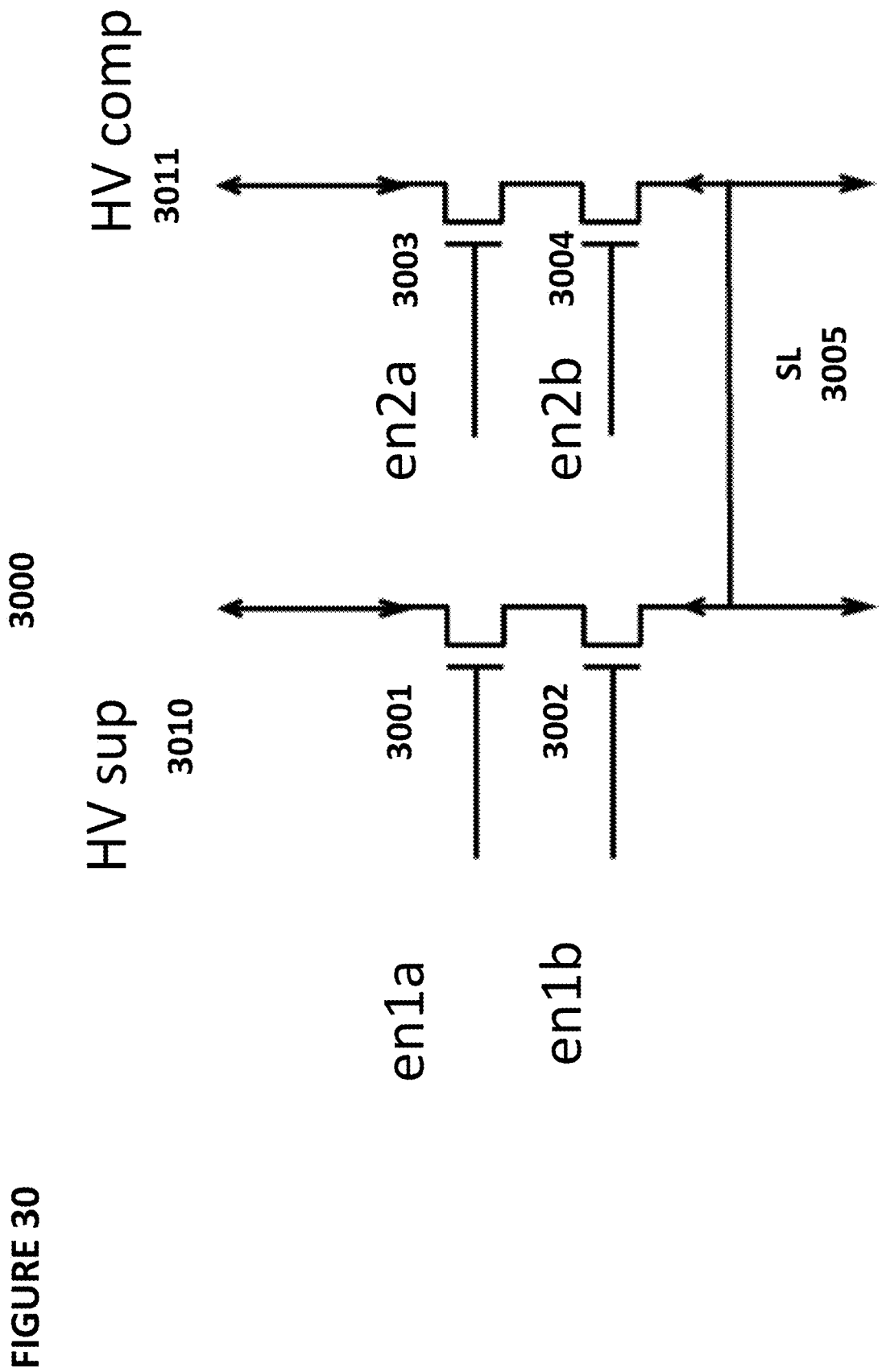
FIG. 30 depicts a high voltage decoder.

FIG. 30 depicts an example of a high voltage decoder block 3000 that can be used in high voltage decoder 2409. Here, source line 3005 is coupled to one or two rows in array 2408. NMOS transistors 3001, 3002, 3003, and 3004 are coupled to source line 3005 as shown. HV supply 3010 is such as from a HV buffer and HV comp signal 3011 is such as shown in FIG. 28.

Figure 31:
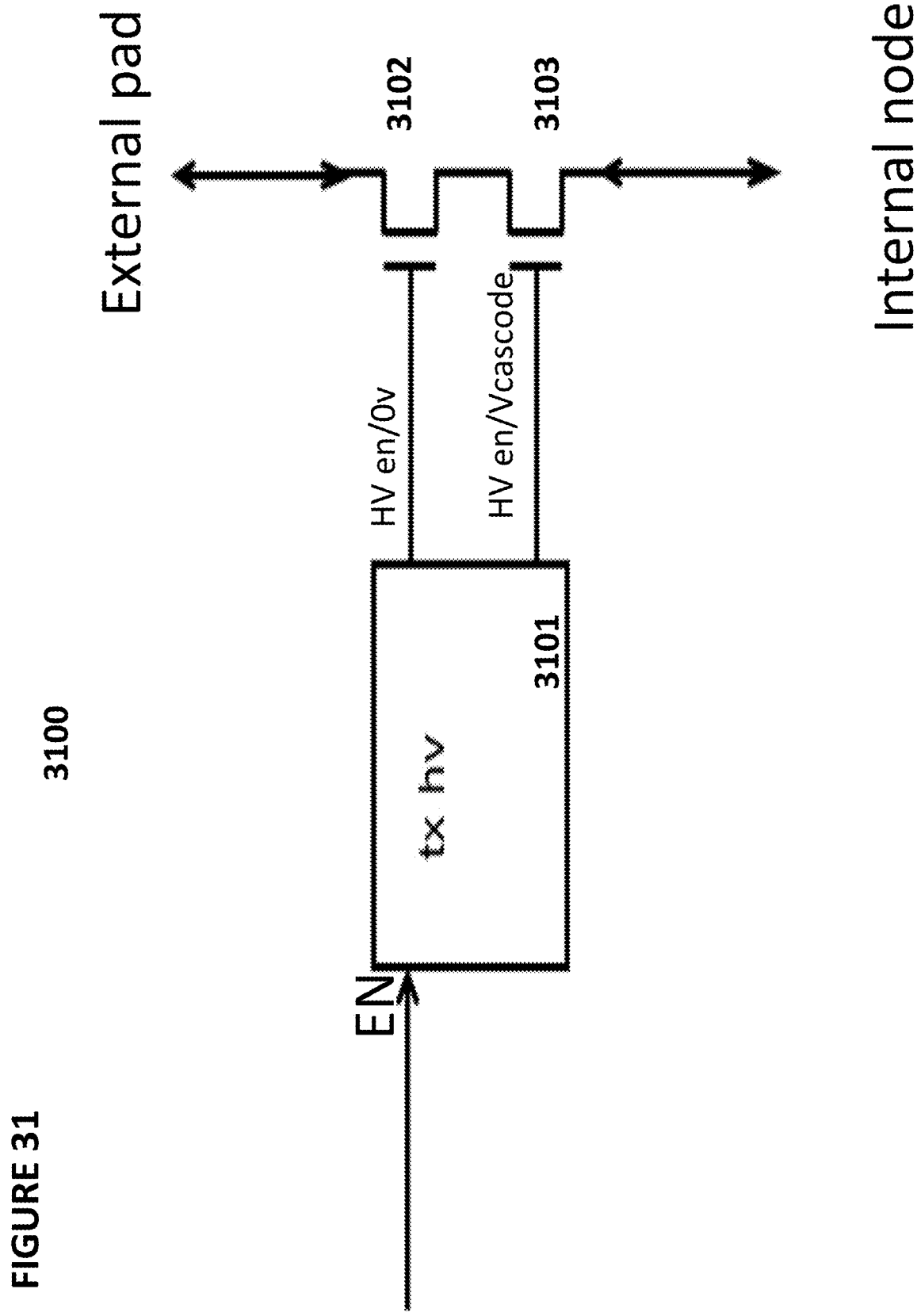
FIG. 31 depicts a high voltage test circuit.

FIG. 31 depicts test circuit 3100. Test circuit comprises high voltage transmitter 3101, which receives an enable signal EN. High voltage transmitter provides a high voltage enable signal to NMOS transistor 3102 and to NMOS cascode transistor 3103. One terminal of NMOS transistor 3201 connects to an external test pad, and one terminal of NMOS transistor 3103 is coupled to an internal node within VMM system 2400. This circuit is used such as for voltage calibration.

Figure 32:
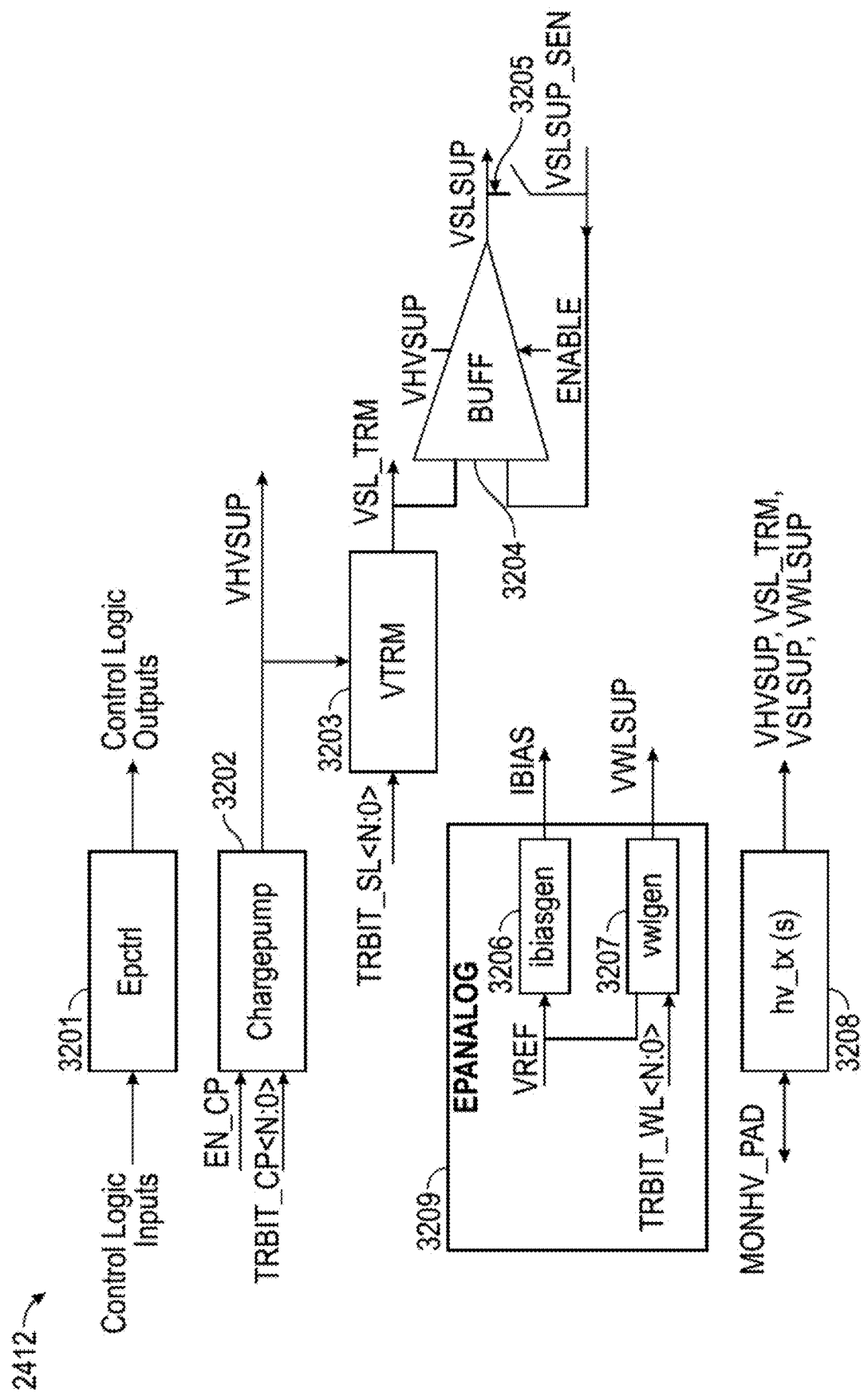
FIG. 32 depicts a high voltage generation block.

FIG. 32 depicts an embodiment of high voltage generation block 2412.

Figure 33:
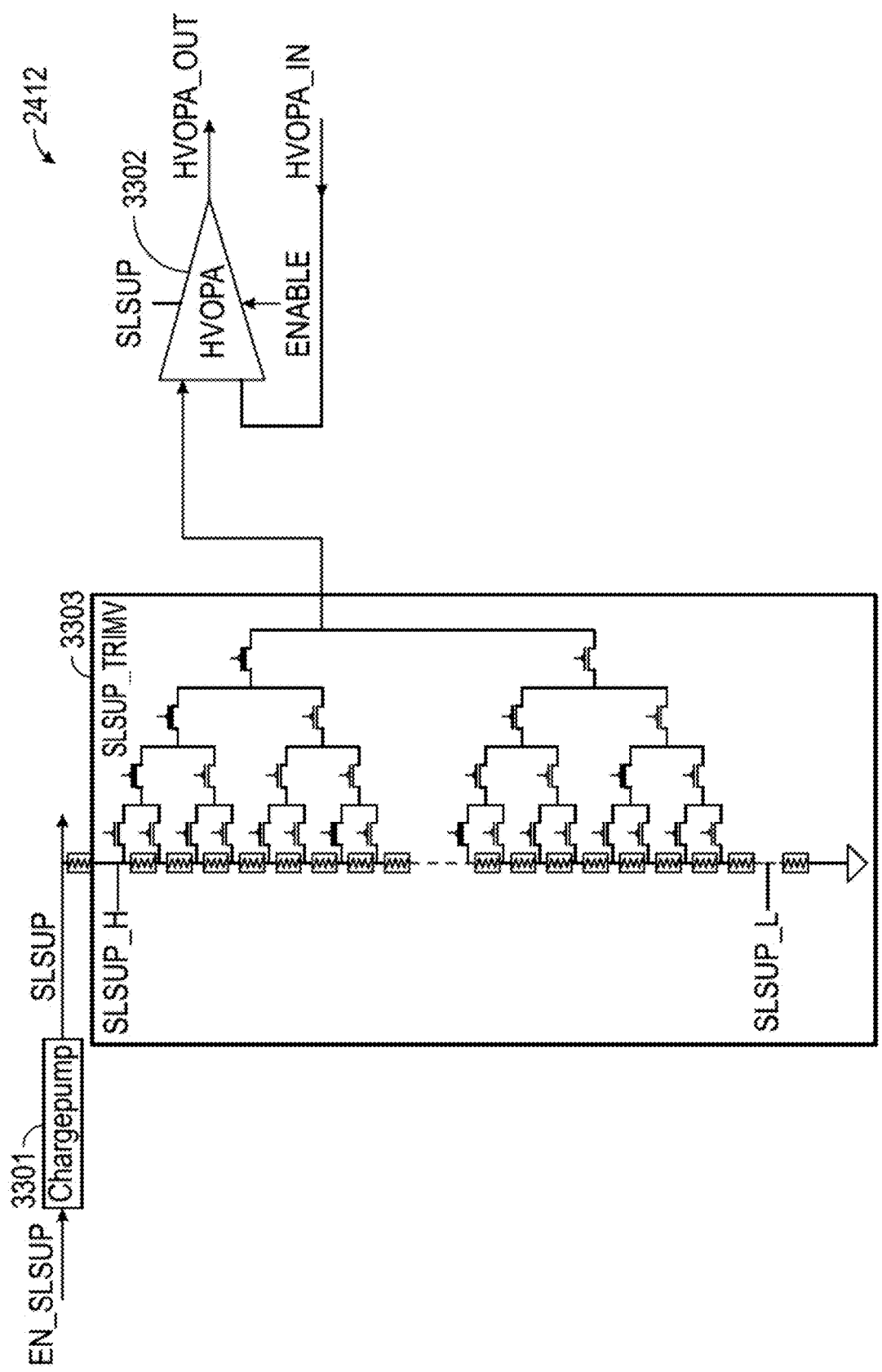
FIG. 33 depicts another high voltage generation block.

FIG. 33 depicts another embodiment of high voltage generation block 2412. Here, high voltage generation block comprises charge pump 3301, charge pump regulator 3303, and high voltage operational amplifier 3302. The voltage of the output of charge pump regulator 3303 can be controlled based on the signals sent to the gates of the NMOS transistors in charge pump regulator 3303.

Figure 34:
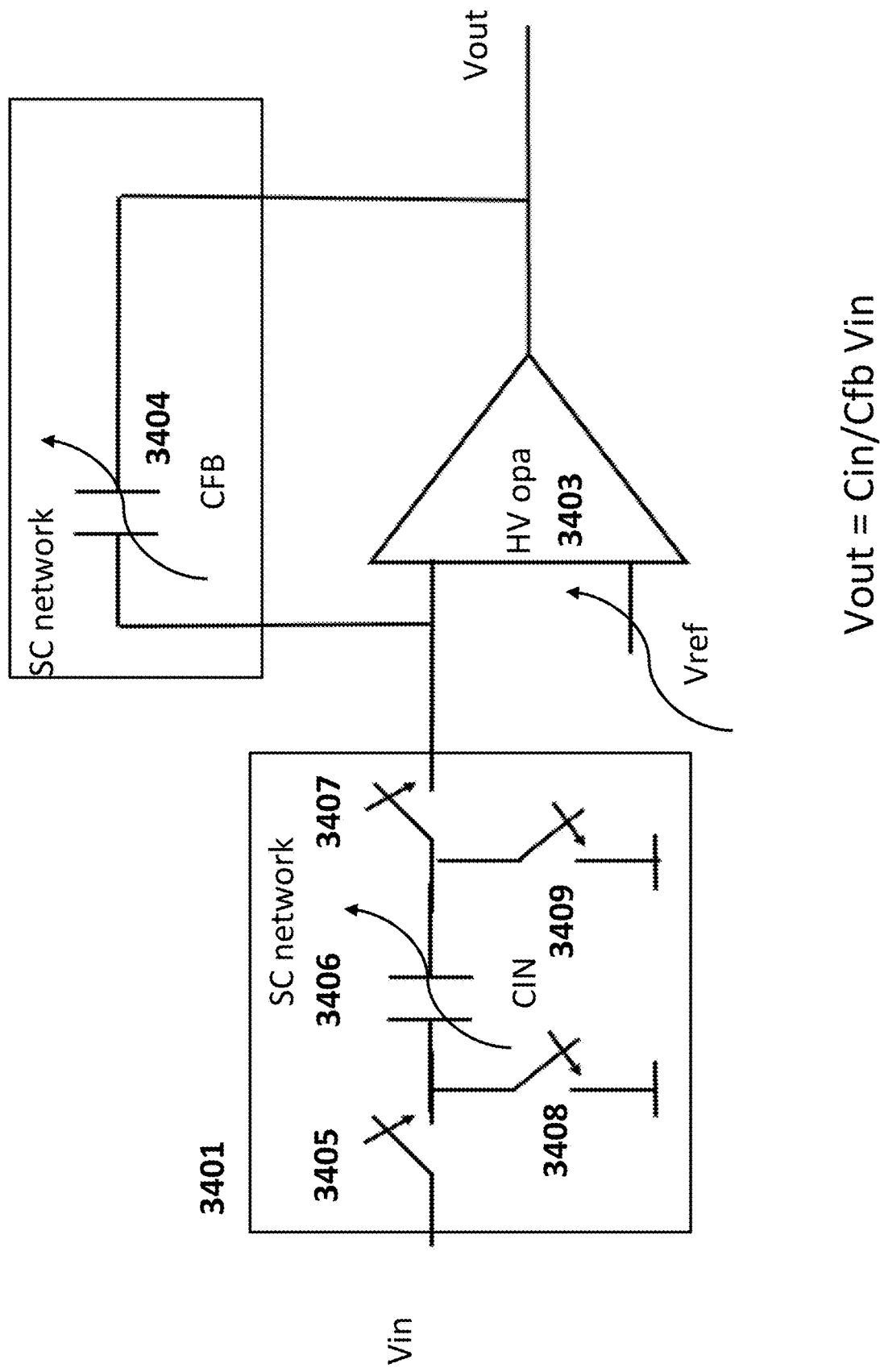
FIG. 34 depicts another high voltage generation block.

FIG. 34 depicts another embodiment of high voltage generation block 2412. High voltage generation block 2412 comprises high voltage operational amplifier 3403, SC (switch cap) network 3402, and SC network 3401. SC network 3402 comprises adjustable capacitor 3404. SC network 3401 comprises switches 3405, 3407, 3408, and 3409 and adjustable capacitor 3406.

Figure 35:
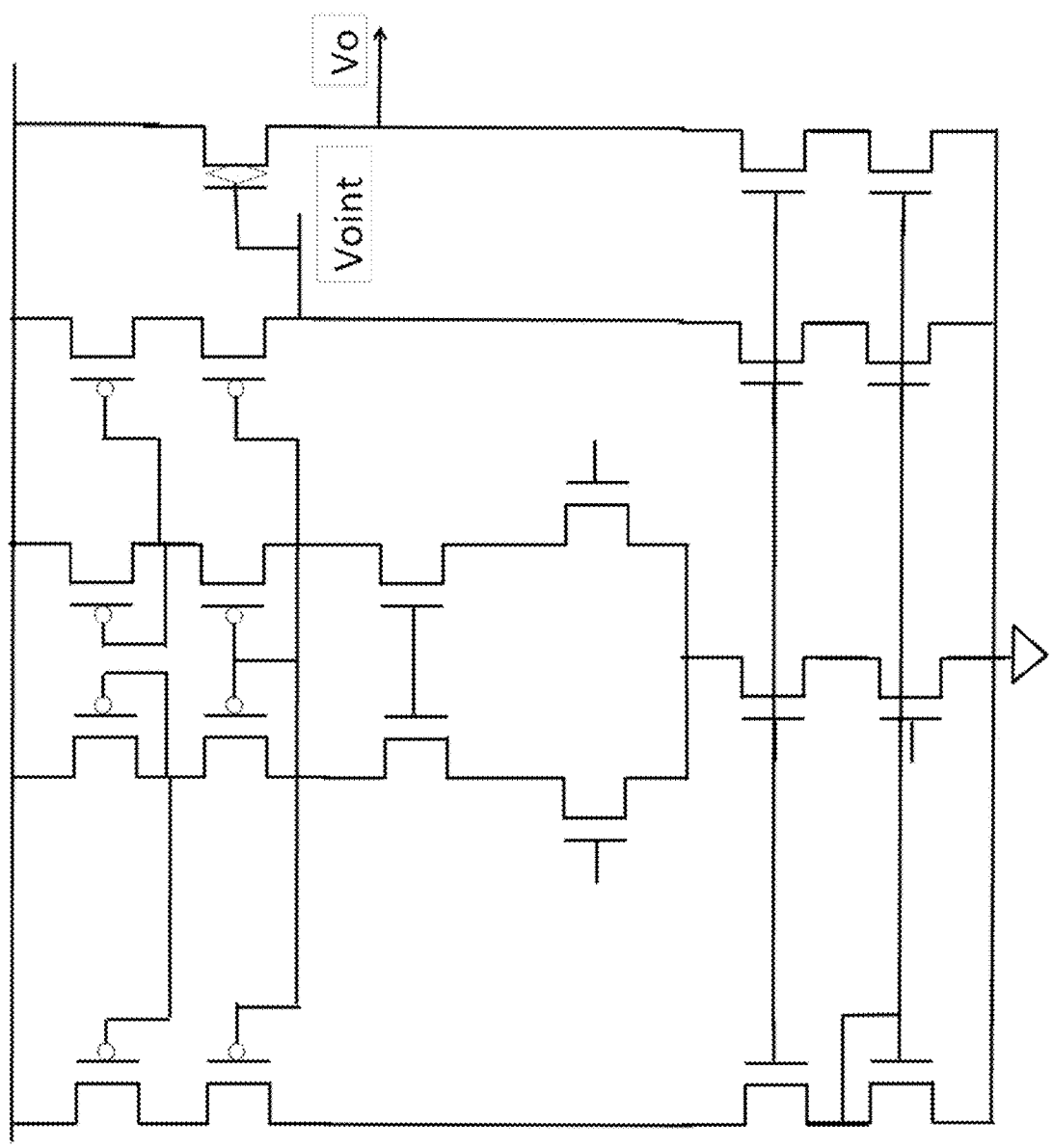
FIG. 35 depicts a high voltage operational amplifier.

FIG. 35 depicts high voltage operational amplifier 3500, which can be used for high voltage operational amplifier 3404 in FIG. 34. High voltage operational amplifier 3500 comprises the components shown in the arrangement shown.

Figure 36:
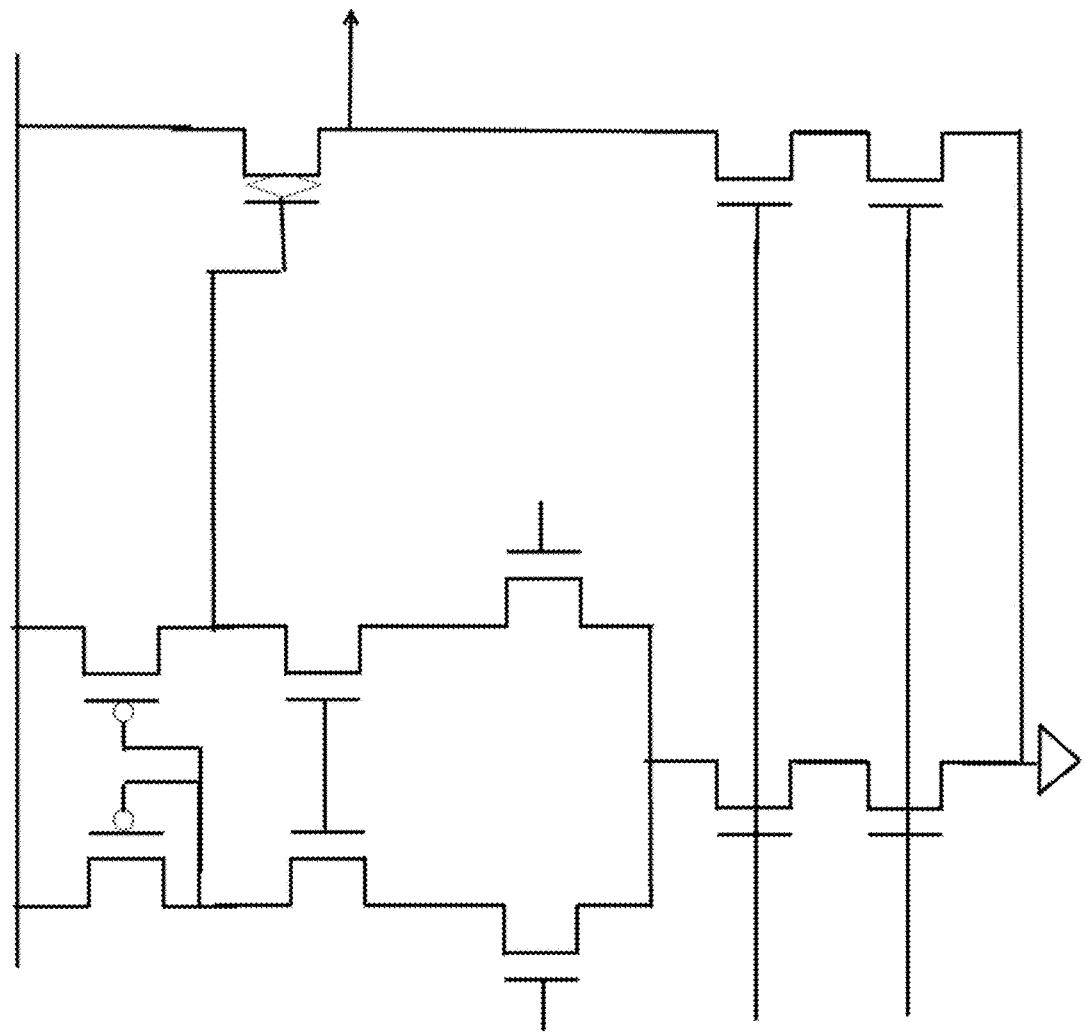
FIG. 36 depicts another high voltage operational amplifier.

FIG. 36 depicts high voltage operational amplifier 3600, which can be used for high voltage operational amplifier 3404 in FIG. 34. High voltage operational amplifier 3600 comprises the components shown in the arrangement shown.

Figure 37:
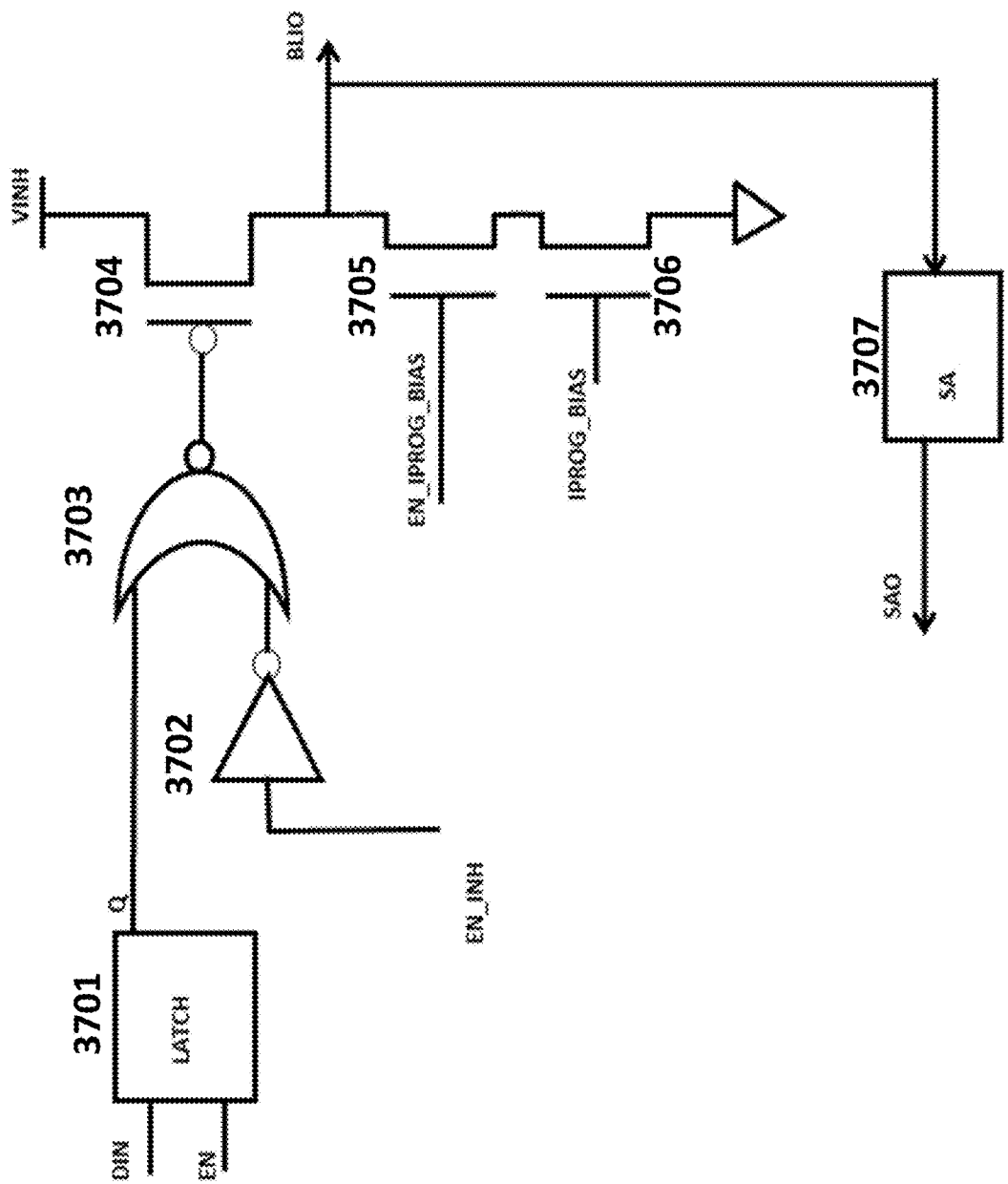
FIG. 37 depicts a column driver.

FIG. 37 depicts column driver 3700, which can be used for bit line drivers 2411. Column driver 3700 comprises latch 3701, inverter 3702, NOR gate 3703, PMOS transistor 3704, NMOS transistors 3705 and 3706 and sense amplifier 3707, in the configuration shown.

Figure 38:
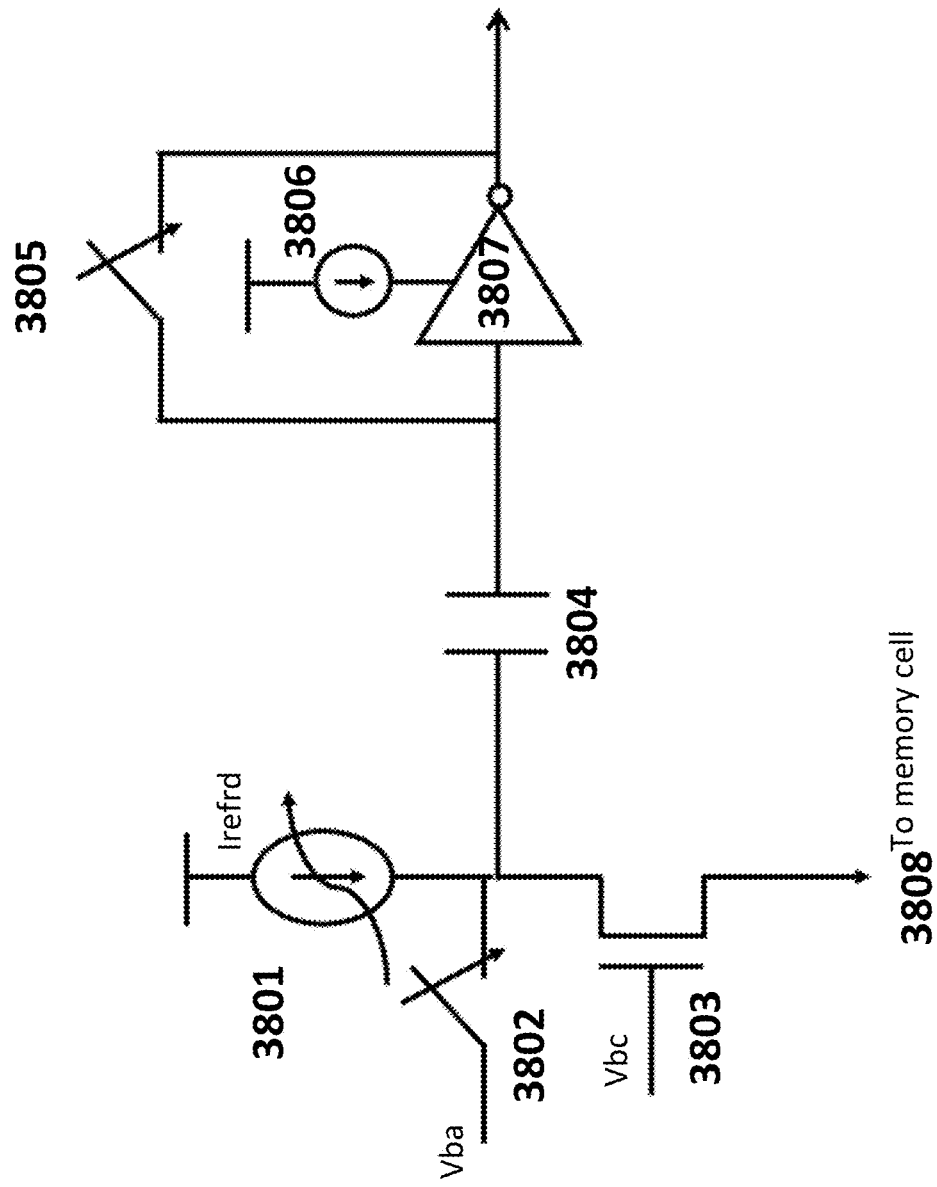
FIG. 38 depicts a column sense amplifier.

FIG. 38 depicts sense amplifier 3800, which can be used for sense amplifier 3707 in FIG. 37. Sense amplifier 3800 comprises adjustable current reference source 3801, switch 3802, NMOS transistor 3803, capacitor 3804, switch 3805, current source 3806, and inverter 3807, in the configuration shown. Sense amplifier 3707 is coupled to memory cell 3808 in array 2408.

Figure 39:
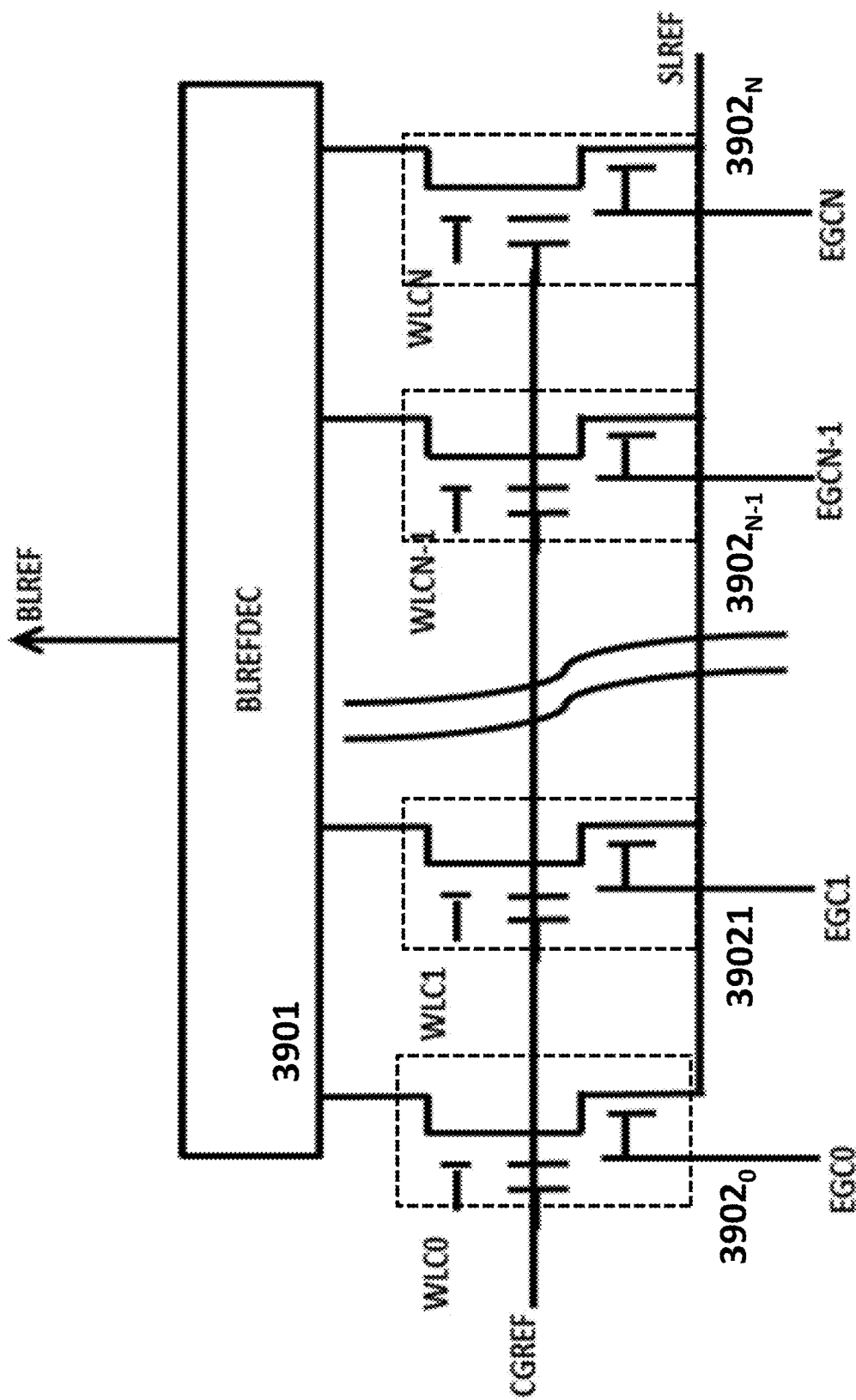
FIG. 39 depicts a read reference circuit.

FIG. 39 depicts reference array circuitry 3900, comprising bit line reference decoder 3901 and reference cells $3901_0$ to $3902_N$.

Figure 40:
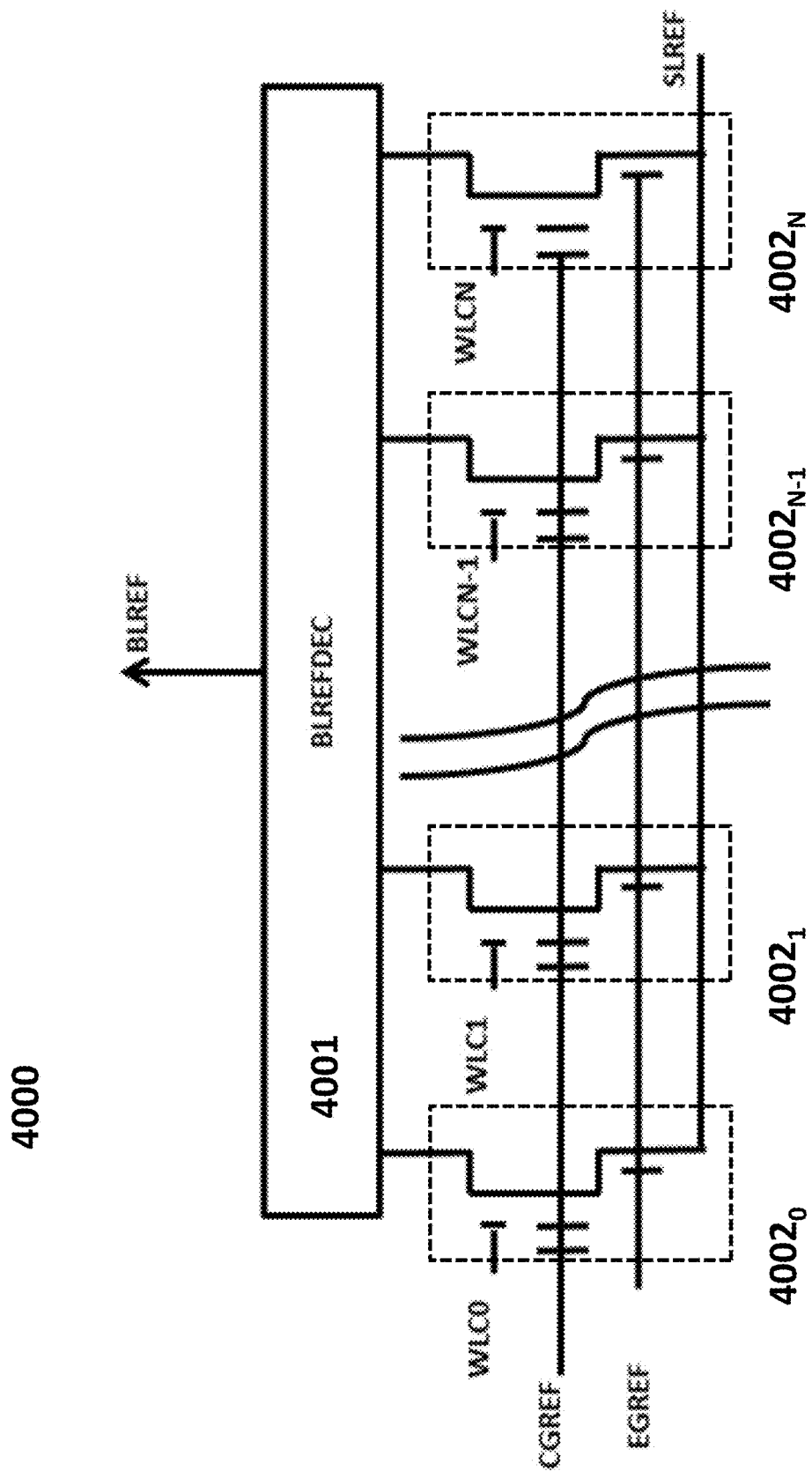
FIG. 40 depicts another read reference circuit.

FIG. 40 depicts reference array circuitry 4000, comprising bit line reference decoder 4001 and reference cells $4002_0$ to $4000_N$.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A method comprising:
   generating a high voltage;
   receiving, by a first input of an operational amplifier, the high voltage;
   providing the high voltage as an output from the operational amplifier to a high voltage decoder;
   programming, by the high voltage decoder, a plurality of non-volatile memory cells in an array using the high voltage when a programming enable signal is asserted; and
   providing feedback from the high voltage decoder as a second input to the operational amplifier, wherein the operational amplifier maintains the high voltage output constant while the plurality of non-volatile memory cells are programmed.

2. The method of claim 1, wherein the programming comprises enabling one or more control gates coupled to the plurality of non-volatile memory cells to control application of the high voltage to the plurality of non-volatile memory cells.

3. The method of claim 1, wherein the programming comprises applying the high voltage to one or more bit lines coupled to the plurality of non-volatile memory cells.

4. The method of claim 1, wherein the plurality of non-volatile memory cells are selected for programming by a digital input signal.

5. The method of claim 1, wherein the plurality of non-volatile memory cells are split-gate flash memory cells.

6. The method of claim 1, wherein the plurality of non-volatile memory cells are stacked-gate flash memory cells.

7. A system comprising:
an array of non-volatile memory cells;
a high voltage generator to generate a high voltage;
an operational amplifier comprising a first input to receive the high voltage, a second input, and an output; and
a high voltage decoder to apply a voltage received from the output of the operational amplifier to one or more selected non-volatile memory cells in the array during a programming operation and to provide feedback to the second input of the operational amplifier wherein the operational amplifier maintains the voltage of its output constant during the programming operation.

8. The system of claim 7, wherein the array is a vector-by-matrix multiplication array.

9. The system of claim 7, wherein the non-volatile memory cells are split-gate flash memory cells.

10. The system of claim 7, wherein the non-volatile memory cells are stacked-gate flash memory cells.

* * * * *